United States Patent [19]
Agrawal

[11] Patent Number: 6,102,963
[45] Date of Patent: Aug. 15, 2000

[54] ELECTRICALLY ERASABLE AND REPROGRAMMABLE, NONVOLATILE INTEGRATED STORAGE DEVICE WITH IN-SYSTEM PROGRAMMING AND VERIFICATION (ISPAV) CAPABILITIES FOR SUPPORTING IN-SYSTEM RECONFIGURING OF PLD'S

[75] Inventor: Om P. Agrawal, Los Altos, Calif.

[73] Assignee: Vantis Corporation, Sunnyvale, Calif.

[21] Appl. No.: 08/998,978

[22] Filed: Dec. 29, 1997

[51] Int. Cl.$^7$ ............................ G06F 17/50; G11C 16/04
[52] U.S. Cl. .......................................... 716/17; 365/185.33
[58] Field of Search ..................................... 364/488, 489, 364/490, 491; 395/500.17, 500.18; 365/185.08, 185.09, 185.1, 185.11, 185.33; 716/1, 17, 16

[56] References Cited

U.S. PATENT DOCUMENTS

| 5,734,868 | 3/1998 | Curd et al. | 395/500 |
| 5,737,567 | 4/1998 | Whittaker et al. | 395/430 |
| 5,764,076 | 6/1998 | Lee et al. | 326/38 |
| 5,841,867 | 11/1998 | Jacobson et al. | 380/25 |

OTHER PUBLICATIONS

Wett and Levy "Flash—The Memory Technology of the Future That's Here Today," Proceedings of the IEEE 1995 National Aerospace and Electronics Conference, May 22–26, 1995, pp. 359–364, vol. 1.

Brown and Logue "Remote Service Methods for Cellular Communications Systems," 1995 IEEE 45th Vehicular Technology Conference, Jul. 25–28, 1995, pp. 170–174, vol. 1, Jun. 1995.

Smith "Ijntel's FLEXlogic FPGA Architecture," Digest of Papers, Compcon '93, Feb. 22–26, 1993, pp. 378–384.

Calligaro et al. "Dichotomic Current–Mode Serial Sensing Methodology for Multistorage Non–Volatile Memories," Proceedings of the 38th Midwest Symposium on Circuits and Systems, 1995, Aug. 13–16, 1995, pp. 3–2–305, vol. 1.

Forella "Flash Memory Mass Storage Technology Tradeoffs," Sixth Biennial IEEE Nonvolatile Memory Technology Conference, Jun. 24–26, 1996, pp.116–119.

Chi and Bergemont "Programming and Erase with Floating–Body for High Density Low Voltage Flash EEPROM Fabricated on SOI Wafers," Proceedings of the 1995 IEEE International SOI Conference, Oct. 3–5, 1995, pp. 129–130.

White et al. "A Low Voltage SONOS Nonvolatile Semiconductor Memory Technology," Sixth Biennial IEEE Nonvolatile Memory Technology Conference, Jun. 24–26, 1996, pp.52–57.

Tawel et al. "A CMOS UV–Programmable Non–Volatile Synaptic Array," IJCNN–91–Seattle International Joint Conference on Neural Networks, Jul. 8–14, 1991, pp. 581–585 vol. 1.

Ranmuthu et al. "Reprogrammable Logic Array Using M–R Elements," IEEE Transactions on Magnetics, Sep. 1990, vol.26, Issue 5, pp. 2828–2830.

(List continued on next page.)

Primary Examiner—Paul R. Lintz
Assistant Examiner—Leigh Marie Garbowski
Attorney, Agent, or Firm—Fliesler, Dubb, Meyer & Lovejoy LLP; Gideon Gimlan

[57] ABSTRACT

An in-system programmable and verifiable (ISPAV) configuration restoring device (CROP device) has an Electrically Erasable and reprogrammable, NonVolatile Integrated Storage array (e.g., a FLASH EE_NVIS array) into which configuration instructions may be written for later readout during configuration restoration of a Programmable Logic Device (PLD) where the PLD has a volatile configuration memory. The volatile PLD may be an FPGA or a CPLD. The ISPAV CROP device includes a shared shift register through which configuration instructions read from the EE_NVIS array are serially shifted out to a to-be-configured PLD. The shared shift register is also used for loading new configuration instructions into the EE_NVIS array by way of a 4-wire interface such as JTAG and also for verifying proper writing of these instructions into the EE_NVIS array.

71 Claims, 9 Drawing Sheets

OTHER PUBLICATIONS

Gallia et al. "High Performance BiCMOS 100k–Gate Array," IEEE Journal of Solid–State Circuits, vol. 25, No. 1, Feb. 1990, pp. 142–1149.

Russ and Stroud "Non–Intrusive Built–In Self–Test for FPGA and MCM Applications," Conference Record of AUTOTESTCON '95. Systems Readiness: Test Technology for the 21st Century, Aug. 8–10, 1995, pp. 480–485.

Wilton "Implementing Logic in FPGA Embedded Memory Arrays: Architectural Implications," Proceedings of the IEEE 1998 Custom Integrated Circuits Conference, May 11–14, 1998, pp. 269–272.

Kawana et al. "An Efficient Logic Block Interconnect Architecture for User–Reprogrammable Gate Array," Proceedings of the IEEE 1990 Custom Integrated Circuits Conference, May 13–16, 1990, pp.31.3/1–31.3/4.

Xilinx Product Specification: XC1700D Family of Serial Configuration PROMs, Jun. 1, 1996 (Version 1.0), pp. 6–1 to 6–10.

ATMEL Product Description: FPGA Configuration $E^2$PROM 65k, 128K and 256K, 0391E–A–May 1997, pp. 1–2.

ATMEL advertisement: Computer Design, Sep. 1997, p. 25.

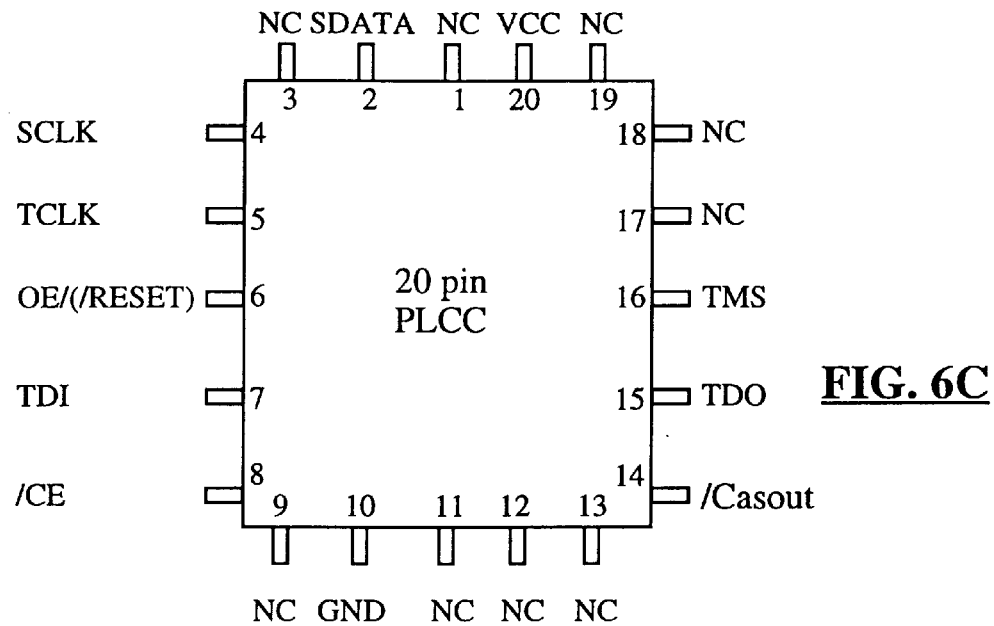
FIG. 6C
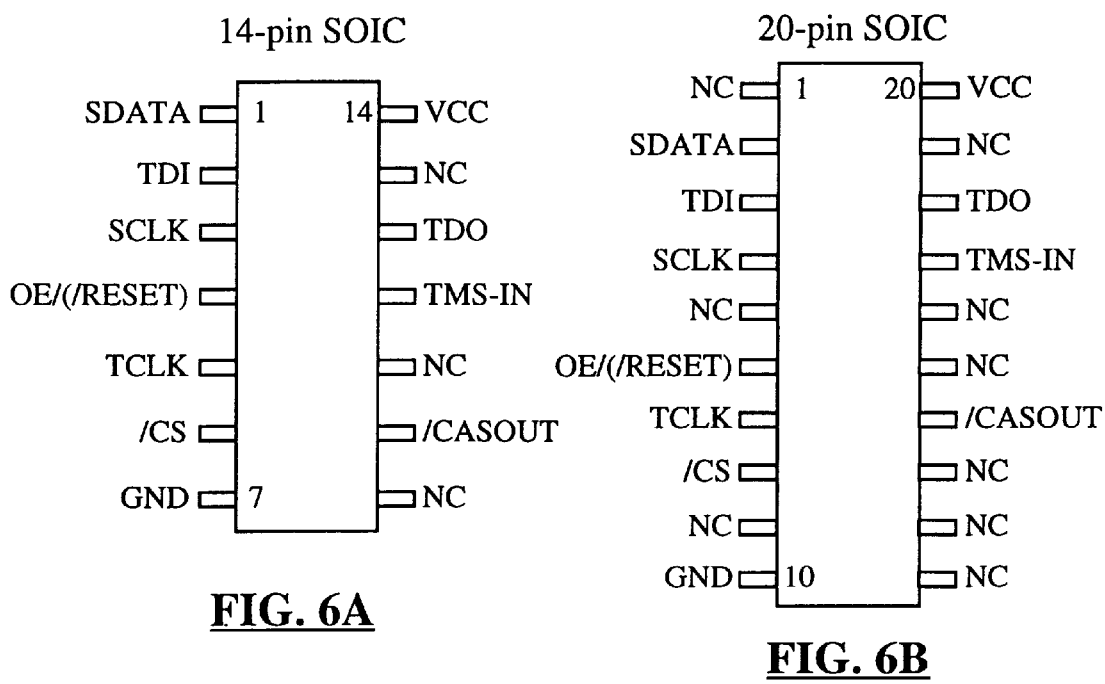
FIG. 6A
FIG. 6B

ID STORAGE DEVICE WITH IN-
SYSTEM PROGRAMMING AND
VERIFICATION (ISPAV) CAPABILITIES FOR
SUPPORTING IN-SYSTEM
RECONFIGURING OF PLD'S

BACKGROUND

1. Field of the Invention

The invention is generally directed to in-system programming (ISP) of programmable logic devices (PLD's). The invention is more specifically directed to nonvolatile memory devices that support in-system reconfiguring of field-programmable gate array devices (FPGA's).

2a. Cross Reference to Related Patents

The disclosures of the following U.S. patent(s) are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES;

(C) U.S. Pat. No. 5,077,691 issued Dec. 31, 1991 to Haddad et al, and entitled, FLASH EEPROM ARRAY WITH NEGATIVE GATE VOLTAGE ERASE OPERATION;

(D) U.S. Pat. No. 4,958,321 issued Sep. 18, 1990 to Chang; Chi and entitled, ONE TRANSISTOR FLASH EPROM CELL; and (E) U.S. Pat. No. 5,617,357 issued Apr. 1, 1997 to Haddad et al, and entitled, FLASH EEPROM MEMORY WITH IMPROVED DISCHARGE SPEED USING SUBSTRATE BIAS AND METHOD THEREFOR.

2b. Cross Reference to Related Other Publications

The following publication(s) is/are believed to be related to the present application and is/are cited here for purposes of reference:

(a) Xilinx Data Manual pages 6-1:6-10 entitled "XC1700D Family of Serial Configuration PROMs" (Jun. 1, 1996).

3. Description of the Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions and bloomed.

One evolutionary branch of FPLD's has grown along a paradigm known as Complex PLD's or CPLD's. This paradigm is characterized by devices such as the Advanced Micro Devices MACH™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, PROM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of an FPGA device can be formed of mixture of different kinds of memory elements if desired (e.g., SRAM and EEPROM) although this is not a popular approach.

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means.

Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means.

In some instances, FPGA devices may additionally include embedded volatile memory for serving as scratchpad memory for the CLB's or as FIFO or LIFO circuitry. The embedded volatile memory may be fairly sizable and can have 1 million or more storage bits in addition to the storage bits of the device's configuration memory.

Modern FPGA's tend to be fairly complex. They typically offer a large spectrum of user-configurable options with respect to how each of many CLB's should be configured, how each of many interconnect resources should be configured, and/or how each of many IOB's should be configured. This means that there can be thousands or millions of configurable bits that may need to be individually set or cleared during configuration of each FPGA device.

Rather than determining with pencil and paper how each of the configurable resources of an FPGA device should be programmed, it is common practice to employ a computer and appropriate FPGA-configuring software to automatically generate the configuration instruction signals that will be supplied to, and that will ultimately cause an unprogrammed FPGA to implement a specific design. (The configuration instruction signals may also define an initial state for the implemented design, that is, initial set and reset states for embedded flip flops and/or embedded scratchpad memory cells.)

The number of logic bits that are used for defining the configuration instructions of a given FPGA device tends to be fairly large (e.g., 1 Megabits or more) and usually grows with the size and complexity of the target FPGA. Time spent in loading configuration instructions and verifying that the instructions have been correctly loaded can become significant, particularly when such loading is carried out in the field.

For many reasons, it is often desirable to have in-system reprogramming capabilities so that reconfiguration of FPGA's can be carried out in the field.

FPGA devices that have configuration memories of the reprogrammable kind are, at least in theory, 'in-system programmable' (ISP). This means no more than that a possibility exists for changing the configuration instructions within the FPGA device while the FPGA device is 'in-system' because the configuration memory is inherently reprogrammable. The term, 'in-system' as used herein indicates that the FPGA device remains connected to an application-specific printed circuit board or to another form of end-use system during reprogramming. The end-use system is of course, one which contains the FPGA device and for which the FPGA device is to be at least once configured to operate within in accordance with predefined, end-use or 'in the field' application specifications.

The possibility of reconfiguring such inherently reprogrammable FPGA's does not mean that configuration changes can always be made with any end-use system. Nor does it mean that, where in-system reprogramming is possible, that reconfiguration of the FPGA can be made in timely fashion or convenient fashion from the perspective of the end-use system or its users. (Users of the end-use system can be located either locally or remotely relative to the end-use system.)

Although there may be many instances in which it is desirable to alter a pre-existing configuration of an 'in the field' FPGA (with the alteration commands coming either from a remote site or from the local site of the FPGA), there are certain practical considerations that may make such in-system reprogrammability of FPGA's more difficult than first apparent (that is, when conventional techniques for FPGA reconfiguration are followed).

A popular class of FPGA integrated circuits (IC's) relies on volatile memory technologies such as SRAM (static random access memory) for implementing on-chip configuration memory cells. The popularity of such volatile memory technologies is owed primarily to the inherent reprogrammability of the memory over a device lifetime that can include an essentially unlimited number of reprogramming cycles.

There is a price to be paid for these advantageous features, however. The price is the inherent volatility of the configuration data as stored in the FPGA device. Each time power to the FPGA device is shut off, the volatile configuration memory cells lose their configuration data. Other events may also cause corruption or loss of data from volatile memory cells within the FPGA device.

Some form of configuration restoration means is needed to restore the lost data when power is shut off and then re-applied to the FPGA or when another like event calls for configuration restoration (e.g., corruption of state data within scratchpad memory).

The configuration restoration means can take many forms. If the FPGA device resides in a relatively large system that has a magnetic or optical or opto-magnetic form of non-volatile memory (e.g., a hard magnetic disk)—and the latency of powering up such a optical/magnetic device and/or of loading configuration instructions from such an optical/magnetic form of nonvolatile memory can be tolerated—then the optical/magnetic memory device can be used as a nonvolatile configuration restoration means that redundantly stores the configuration data and is used to reload the same into the system's FPGA device(s) during power-up operations (and/or other restoration cycles).

On the other hand, if the FPGA device(s) resides in a relatively small system that does not have such optical/magnetic devices, and/or if the latency of loading configuration memory data from such an optical/magnetic device is not tolerable, then a smaller and/or faster configuration restoration means may be called for.

Many end-use systems such as cable-TV set tops, satellite receiver boxes, and communications switching boxes are constrained by prespecified design limitations on physical size and/or power-up timing and/or security provisions and/or other provisions such that they cannot rely on magnetic or optical technologies (or on network/satellite downloads) for performing configuration restoration. Their designs instead call for a relatively small and fast acting, non-volatile memory device (such as a securely-packaged EPROM IC), for performing the configuration restoration function. The small/fast device is expected to satisfy application-specific criteria such as: (1) being securely retained within the end-use system; (2) being able to store FPGA configuration data during prolonged power outage periods; and (3) being able to quickly and automatically re-load the configuration instructions back into the volatile configuration memory (SRAM) of the FPGA device each time power is turned back on or another event calls for configuration restoration.

The term 'CROP device' will be used herein to refer in a general way to this form of compact, nonvolatile, and fast-acting device that performs 'Configuration-Restoring On Power-up' services for an associated FPGA device.

Unlike its supported, volatilely reprogrammable FPGA device, the corresponding CROP device is not volatile, and it is generally not 'in-system programmable'. Instead, the CROP device is generally of a completely nonprogrammable type such as exemplified by mask-programmed ROM IC's or by once-only programmable, fuse-based PROM IC's. Examples of such CROP devices include a product family that the Xilinx company provides under the designation 'Serial Configuration PROMs' and under the trade name, XC1700D™. These serial CROP devices employ one-time programmable PROM (Programmable Read Only Memory) cells for storing configuration instructions in non-volatile fashion.

It is to be noted as a slight digression here, that abbreviated terms such as 'PROM' (which may stand for: once Programmable Read Only Memory), 'EPROM' (which may stand for: Eraseable and Programmable Read Only Memory) and 'EEPROM' or 'E-squared PROM' (which may stand for: Electrically Erasable and reProgrammable Read Only Memory) bear historical connotations in the industry with respect to the physics employed therein for performing programming and erasure (if any) operations. Fair debate may take place as to what specifically each of these abbreviated terms means when found in a specific publication.

In the following description, 'EPROM' shall be understood to refer to a nonvolatile form of integrated storage that relies on hot electron injection both for programming and erasure operations.

The term 'integrated storage' as used herein implies storage circuitry that is monolithically included in an integrated circuit chip or at least manufactured using the fabrication techniques of integrated circuits. The term 'integrated storage' excludes nonvolatile forms of storage such as magnetic disk, optical disk, and tape which rely on some form of mechanical motion for their operations.

Further in the following description, 'EEPROM' or 'E-squared PROM' shall be understood to refer to a nonvolatile form of integrated storage that relies on Fowler-Nordheim (FN) tunneling both for programming and erasure operations.

Additionally in the following description, 'FLASH' shall be understood to refer to a nonvolatile form of integrated storage that relies on Fowler-Nordheim (FN) tunneling for erasure operations and on hot electron injection for programming operations.

To avoid confusion, the term 'NE_NVIS' (Not Electrically-erasable, NonVolatile Integrated Storage) will be used herein to refer more generally to integrated devices which may be electrically programmed at least once to store data nonvolatilely but which may not be electrically erased. Thus, once-only programmable, fuse-based PROM IC's, and even the many-times programmable, UV-erasable PROM IC's all fall under the definition of 'NE_NVIS' because, although they are electrically programmable, they are not electrically-erasable. Mask-programmed ROM IC's do not because they are not electrically programmable. FLASH devices also do not fall under the definition of 'NE_NVIS' because they are electrically-erasable.

The term 'NP_NVIS' (Not Programmable, NonVolatile Integrated Storage) will be used herein to refer generally to integrated devices which store data nonvolatilely but cannot be electrically programmed even once nor electrically erased. Mask-programmed ROM IC's are an example of NP_NVIS. Laser-programmed ROM IC's can be another example.

The term 'EE_NVIS' (Electrically Erasable and reprogrammable, NonVolatile Integrated Storage) will be used herein to refer generally to integrated devices which may be electrically programmed and electrically erased multiple times while storing data nonvolatilely between each programming and subsequent, if any, erasure operation. EPROM devices, EEPROM devices, and FLASH devices all fall under the definition of 'EE_NVIS' as used herein. UV-erasable PROM IC's do not because they are not electrically erasable.

Returning to the original topic, suppose it is desirable to reconfigure an in-the-field, FPGA system. Suppose further that configuration restoration relies on either a NP_NVIS form of CROP device (which is not reprogrammable) or an NE_NVIS form of CROP device (which is not electrically erasable). In such a case, a commonly used procedure calls for physical removal of the original NP/NE_NVIS CROP device from the system and replacement with a substitute NP/NE_NVIS CROP device. The substitute CROP device contains the new FPGA configuration data that will be loaded into the FPGA device during the next restoration cycle.

Even in cases where the original CROP device is a multi-reprogrammable NE_NVIS device, meaning that it is a reprogrammable device such as UV-erasable PROM, the original CROP device may still need to be physically removed from the system (or otherwise manually acted on) so as to provide for erasure (e.g., by way of exposure to UV radiation) and for reprogramming of the device (e.g., using voltages higher than can be withstood in-system) before the device is reintroduced back into the end-use system.

The phrase, 'CROP rotation' will be used herein to refer to the act of changing the configuration data held within a CROP device irrespective of whether such a change is accomplished with or without replacement or other manual handling of the CROP device.

The phrase, 'physical CROP rotation' will be used herein to refer to the act of changing the configuration data held within a CROP device by way of physical substitution or other manual handling. 'In-field physical CROP rotation' will refer to physical CROP rotation that is carried out on an end-use system while the latter system is out in the field (as opposed to being brought back to a repair station for rework).

In-field physical CROP rotation is disadvantageous because the in-the-field handling (for replacement or reprogramming of the CROP device) tends to be costly and time-consuming. In some instances the in-system FPGA and/or the remainder of the end-use system needs to be shut-down during the CROP rotation operation. End-users are then deprived of the resources of the in-system FPGA and/or of the remainder of the end-use system during the operation.

It would be beneficial to have an arrangement in which in-system reconfiguration of SRAM-based FPGA's or of other such volatile PLD's can take place without resorting to physical CROP rotation.

SUMMARY OF THE INVENTION

An in-system programmable and verifiable (ISPAV) nonvolatile memory device (CROP device) is provided in accordance with the invention for supporting SRAM-based FPGA's or of other such PLD's having volatile configuration memories.

One embodiment of an ISPAV CROP device in accordance with the invention uses a serial interface such as a JTAG boundary-scan subsystem for configuration data down-loading and verification. A combination of a FLASH EE_NVIS array and a serial interface is provided within the ISPAV device for enabling high-speed data down-loading, verification and output. The FLASH EE_NVIS array is a nonvolatile memory that relies on Fowler-Nordheim tunneling for providing electric erasability.

One embodiment of an ISPAV device in accordance with the invention includes a protective housing for its circuitry where the housing has a relatively small number of interface terminals such as 20 pins or less. An alternate embodiment comprises an MCM (Multi-Chip Module) inside of whose protective package there are provided both an ISPAV device in accordance with the invention and an associated SRAM-based FPGA chip or another PLD having volatile configuration memory.

Other aspects of the invention will become apparent from the below detailed description.

BRIEF DESCRIPTION OF THE DRAWINGS

The below detailed description makes reference to the accompanying drawings, in which:

FIG. 6A is a top plan view of a 14-pin SOIC packaged, CROP device in accordance with the invention;

FIG. 6B is a top plan view of a 20-pin SOIC packaged, CROP device in accordance with the invention;

FIG. 6C is a top plan view of a 20-pin PLCC packaged, CROP device in accordance with the invention;

DETAILED DESCRIPTION

Figure 1:
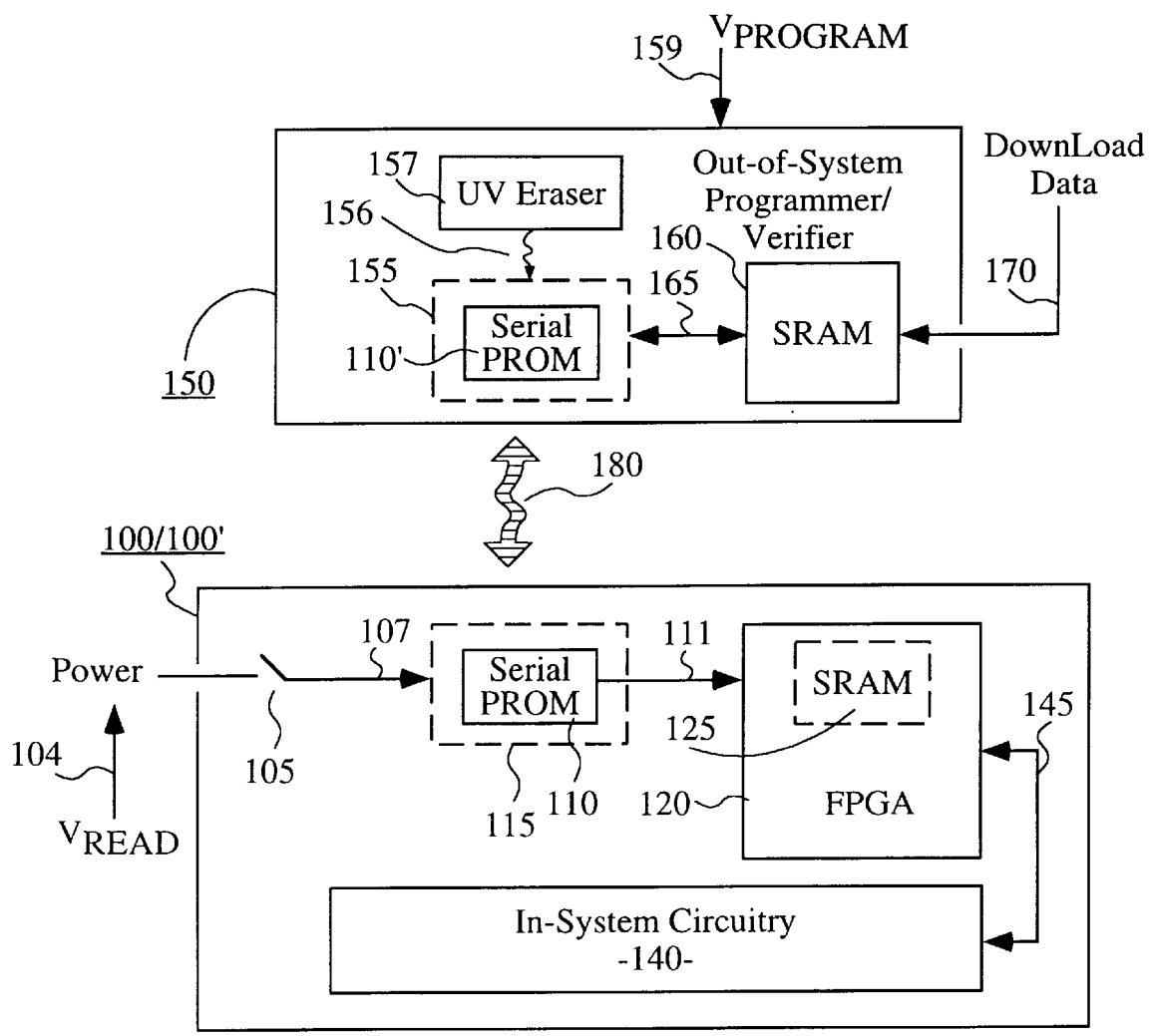
FIG. 1 is a first block diagram provided for explaining a physical removal process that has been conventionally used for reconfiguration of in-system FPGA'S.

FIG. 1 shows a conventional arrangement in which a first a printed circuit board 100 or another form of end-use system has a volatilely-configurable FPGA device 120 embedded therein in a relatively non-removable manner. The relatively non-removable embedding can be by way of soldered connections or by another like coupling method which makes physical removal of the FPGA device 120 from the end-use system 100 generally unappealing. Typically, the FPGA device 120 will be in the form of an IC package with a relatively large number of pins (e.g., more than about 50).

For purposes of application-specific operation of the end-use system 100, the FPGA device 120 may be operatively intercoupled with additional in-system circuitry. Such additional circuitry is designated as 140 in FIG. 1 and the intercoupling is designated as 145. This operative intercoupling 145 of the FPGA device 120 and the additional in-system circuitry 140 may provide some necessary or desirable functionality of the end-use system 100 during normal operations of the end-use system. Alternatively, FPGA device 120 may by itself provide a necessary or desirable functionality of the end-use system 100.

FPGA device 120 has a volatile configuration memory 125 such as SRAM. A serial link 111 is provided for loading configuration instructions from an NP/NE_NVIS memory device 110 (CROP device 110) into SRAM 125. CROP device 110 is inside an IC package that is separate from the IC package of FPGA 120. The IC package of CROP device 110 is removably inserted into an on-board socket 115. Socket 115 may be of the zero-insertion force (ZIF) type or of a like type of connector that allows the CROP device 110 to be removed in a relatively convenient manner from the end-use system 100 and to be later reinserted. In either case, socket 115 consumes space and adds to system cost while potentially reducing security The relatively easy removability of the CROP device 110 is to be contrasted with the relative non-removability of FPGA device 120. A double-headed arrow symbol 180 is included in FIG. 1 to indicate the removability and reinsertability of memory device 110 from/into end-use system 100.

In the illustrated system of FIG. 1, CROP device 110 is assumed to be a UV-erasable PROM form of NE_NVIS device (Not Electrically-erasable, NonVolatile Integrated Storage device) having a serial interface 111 and a power-up detecting interface 107. It is further assumed that, in a first instance, the UV-erasable PROM device 110 (CROP device 110) is already programmed to contain configuration instructions for loading into SRAM 125 of FPGA 120.

When switch 105 is actuated into a closed position to thereby apply power to system 100, the power-up detecting interface 107 of the serial PROM device 110 detects the power-up sequence. At an appropriate time during the power-up sequence, the serial PROM device 110 outputs its contained configuration instructions through serial link 111 into SRAM 125. The FPGA 120 is in a power-up loading mode at this time. It is understood that the power applied to end-use system 100 includes an appropriate voltage $V_{READ}$ as indicated at 104 for enabling reading of data out of the serial PROM device 110.

After proper in-loading of configuration instructions into SRAM 125, FPGA 120 switches into a normal operations mode and becomes ready to either function on its own in accordance with the in-loaded configuration instructions or to operatively cooperate with the additional in-system circuitry 140 by way of intercoupling 145. This process of reloading configuration data into FPGA 120 is repeated each time switch 105 cycles through a power-up sequence.

Assume that, in a second instance, it is desirable to alter the configuration instructions stored in serial PROM device 110 so that FPGA device 120 will behave differently after a next power-up sequence. In this second instance, physical CROP rotation is employed. The serial PROM device 110 is physically removed from the in-system socket 115 and transferred (180) to the socket 155 of an out-of-system programmer/verifier 150. The so-transferred serial PROM device is now referenced as 110'. The out-of-system programmer/verifier 150 is either a portable device that has been brought to an infield location of system 100 or the serial PROM device 110 has been brought to the location of the programmer/verifier 150.

The out-of-system programmer/verifier 150 includes an ultraviolet source 157 for erasing the configuration instructions previously stored in UV-PROM 110'. Symbol 156 represents blanket erasure by UV rays.

After erasure completes, new configuration instructions are downloaded by way of link 170 into a temporary memory buffer 160 of programmer/verifier 150. The downloaded instructions are then transferred from temporary memory buffer 160 into the serial PROM device 110' by way of link 165. It is understood that the power applied to programmer/verifier 150 includes one or more appropriate voltages, $V_{PROGRAM}$ as indicated at 159 for enabling writing of new data into the serial PROM device 110'. In older configurations, the out-of-system programmer/verifier 150 may include a dual polarity, high voltage circuitry (e.g., −12V and +12V) for re-programming device 110'. In such cases, the end-use system 100 may lack means for providing the one or more appropriate voltages, $V_{PROGRAM}$ needed for reprogramming device 110'.

After the programming operation completes, link 165 may be used to compare the data that has been programmed into serial PROM device 110' against the data downloaded into temporary memory 160. This is done to verify that the new configuration instructions have been correctly programmed into device 110'.

After out-of-system programming and verification completes, the re-programmed PROM device 110' is transferred (180) back to the original system and reinserted into socket 115. The end-use system that contains the re-programmed PROM device 110' is now referenced as 100' because it will behave differently in accordance with the new instructions in the reprogrammed PROM device 110'. During a next power-up of end-use system 100', the new configuration instructions within the re-programmed PROM device 110' will be loaded via link 111 into configuration memory 125. FPGA 120 will then behave in accordance with the new configuration instructions.

With respect to the just described process of physical CROP rotation, it should be noted that during the time in which the serial PROM device 110 is out of the system socket 115, it is often necessary or prudent to shut off the power to FPGA device 120, and generally also to its interoperative circuitry 140. One drawback of this is that end-users of system 100/100' are deprived of the functionality of FPGA 120, and perhaps of its associated circuitry 140. The deprivation will last at least for the duration of the physical CROP rotation.

Other drawbacks of the above-described, physical CROP rotation method are the cost and manual labor involved in moving the serial PROM device 110 back and forth between the end-use system 100 and the out-of-system programmer/verifier 150. Also, there is the danger that device 110 may be damaged during the physical transfer 180.

Figure 2A:
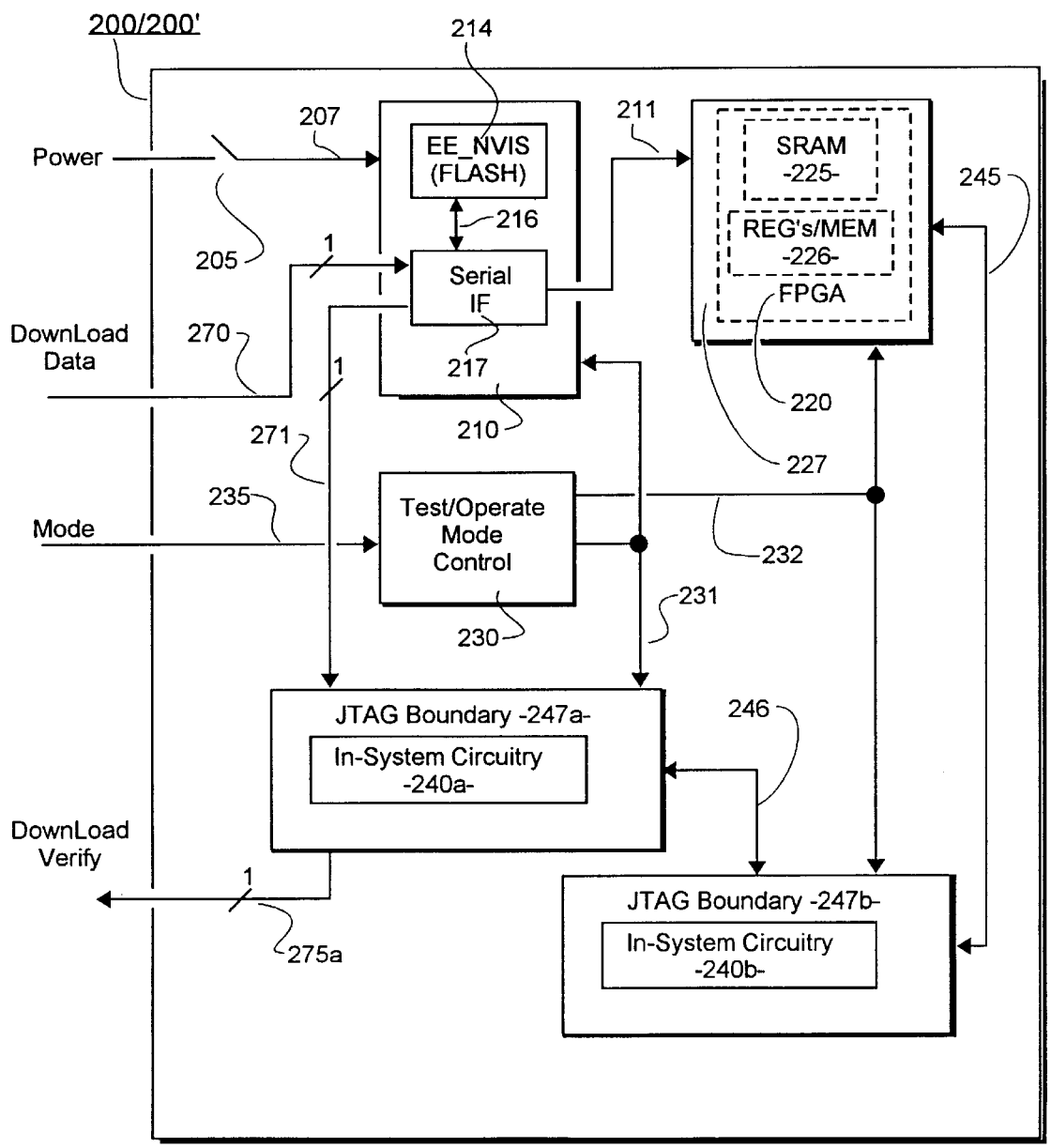
FIG. 2A is a second block diagram provided for explaining an in-system programming and verifying process in accordance with the invention.

FIG. 2A is a block diagram of an improved FPGA-based system 200/200' in accordance with the invention. Like reference symbols and numbers in the '200' century series are used for elements of FIG. 2A which correspond to but are not necessarily the same as the elements represented by similar symbols and reference numbers of the '100' century series in FIG. 1. As such, an introductory description of the elements found in FIG. 2A is omitted here.

An improved CROP device 210 is provided within the correspondingly improved system 200/200'. Unlike removable NE_NVIS device 110 of FIG. 1, the improved CROP device 210 may be arranged such that it is not easily removable from system 200/200'. For example, improved CROP device 210 may be soldered into place on a printed circuit board of system 200/200'. (Alternatively, provisions for easy removability such as placement in a socket could be made if desired. Note however, that elimination of socket 115 reduces system costs and frees the space previously consumed by socket 115.)

More importantly, the improved CROP device 210 is in-system programmable and verifiable (ISPAV) while retaining a relatively small footprint in the improved system 200/200'.

The phrase, 'in-system programmable and verifiable'or 'ISPAV' as used herein indicates that, old data may be electrically-erased, new configuration-data may be programmed into the improved CROP device 210 while the device 210 remains coupled to the end-use system 200/200' and that proper programming of the improved CROP device 210 may also be verified while the device 210 remains coupled to the end-use system 200/200'. Device 210 is therefore referred to as an ISPAV CROP device.

As before, CROP device 210 is defined for the embodiment of FIG. 2A as a compactly packaged, integrated circuit with a relatively small number of package pins such as 20 or less. An Electrically Erasable and reprogrammable, Non-Volatile Integrated Storage array (EE_NVIS array) 214 is provided within the ISPAV CROP device 210.

EE_NVIS array 214 may be an EEPROM array whose erase and programming operations both rely on Fowler-Nordheim tunneling. In a preferred embodiment however, array 214 is a FLASH memory array whose erase operations rely on FN tunneling and whose programming operations rely on hot electron injection. There are several advantages to using FLASH technology instead of EEPROM technology. First, FLASH memory technologies tend to provide comparatively greater storage density as measured on a transistors-per-logic-bit basis. In one embodiment, each FLASH cell has dimensions of approximately one to two square microns or less. A stacked gate, double polysilicon layer process is used to form compact floating gate transistors for defining the FLASH cells. (Multi-level charge storage may be used for each such cell wherein the charge stored in the floating gate of each transistor can represent one of 4 or more logic states, e.g. 00, 01, 10, 11.) Flash memories for storing at least as many as 1 MegaBit of data may be conveniently incorporated within the integrated circuit chip of the CROP device 210. When submicron technologies are used and/or multi-level charge storage technologies are used, it is possible to incorporate within the integrated circuit chip of the CROP device 210, a flash memory capacity of 4 MegaBits of data or 8 MegaBits of data or more.

A second reason for preferred use of FLASH memory is that FLASH memory technology tends to provide a greater number of reprogramming cycles over device lifetime than does EEPROM technology. Typically, a FLASH array will be able to endure at least 100,000 reprogramming cycles or more over its lifetime. Older EPROM or EEPROM technologies may not be able to assuredly handle more than about 1,000 reprogramming cycles over device lifetime. Thus the endurance of FLASH memory technology tends to be orders of magnitude greater than the endurance of the older EPROM or EEPROM technologies. This is important because the SRAM-based FPGA device 220 that is associated with the ISPAV CROP device 210 is expected to be indefinitely reprogrammable. Such long term reprogrammability loses part of its value if the companion CROP device 210 does not have comparable endurance. (Of course the CROP device 210 is not expected to be reprogrammed as often as the FPGA device 220. Nonetheless, some system designs may call for much more than 1,000 reprogramming cycles for the CROP device over the expected lifetime of the system.

A third reason for preferred use of FLASH memory is that FLASH arrays may be reprogrammed using relatively low voltages and/or power draws. On-chip charge pumps or the like enable some FLASH arrays to operate at low power while drawing their energy from chip-external, monopolarity power supplies that provide only say, +5V or +3.3V or +2.2V or +1.8V.

A serial interface circuit 217 is provided within CROP device 210. The serial interface circuit 217 is bidirectionally coupled to the EE_NVIS array 214 as indicated by coupling 216. The serial interface circuit 217 further has serial links 270 and 271 for supporting JTAG-based or other, serial receipt of configuration data and serial transmission of test data. As used herein, IJTAGI refers at least to IEEE standard 1149.1 as was effective at least in the year 1996.

During a general configuration restoration mode of device 210, which may occur for example when a power-up sequence (205) is detected by a power-up detecting interface 207 of the ISPAV CROP device 210, configuration-restoration takes place as follows. The power-up detecting interface 207 responsively initiates a data transfer upon detecting the power-up sequence. Configuration instructions that had been previously stored within the EE_NVIS array 214 are passed through internal link 216 to the serial interface 217 and from there by way of serial link 211 into the SRAM 225 of FPGA device 220.

Note that FPGA device 220 may include configurable registers and/or embedded memory 226 in addition to configurable SRAM 225. Configuration instructions may be directed to establishing initial states in the configurable registers 226, and/or establishing initial states in embedded memory—which memory may be considered an extension of or an alternative for the configurable registers 226—as well as, or in addition to the establishing of an initial configuration state in the configuration memory 225. Accordingly, when reconfiguration of FPGA device 220 is discussed here and below, it is understood to contemplate any one or more of: {1} establishing of an initial configuration state in the configuration memory 225, {2} establishing initial states in the configurable registers 226, and {3} establishing initial states in the embedded memory 226. The EE_NVIS array 214 will of course have sufficient memory capacity for storing the corresponding configuration data for the configuration memory 225, and if applicable, for storing the corresponding initial configuration data for one or both of the configurable registers 226 and the embedded memory 226. This may call for an EE_NVIS array 214 that stores at least 2 Mb or at least 4 Mb or at least 8 Mb of data, where 1 Mb corresponds to one megabits of storage data.

During a programming mode of device 210, new configuration instructions are downloaded by way of serial link 270 into serial interface 217 and through internal link 216 into EE_NVIS array 214.

In a subsequent verification mode of device 210, the data that had been programmed into EE_NVIS array (e.g., FLASH array) 214 is passed back through internal link 216 and through serial interface 217 for output on serial verification line 271. The data on serial verification line 271 can then be compared against the data initially downloaded on serial-input line 270 to make sure that EE_NVIS array 214 had been properly programmed. If not, programming may have to be tried again, with or without prior erasure, until the desired data pattern is verified as having been correctly established in the EE_NVIS array 214.

In one embodiment, serial verification line 271 forms a serial part of a JTAG boundary-scanning chain that further includes JTAG-linking line 275a and an interposed, JTAG boundary-scanning section 247a of a first in-system, circuit section 240a. Such inclusion of the serial interface 217 and its associated serial lines, 270 and 271, within the JTAG serial chain of JTAG boundary-scanning section 247a helps to reduce the overall system costs for supporting the in-system programming and verification (ISPAV) capabilities of CROP device 210.

In an alternate embodiment, lines 270 and 271 are merged to define a bidirectional serial link where configuration data is received and test data is output over a same line.

The embodiment shown in FIG. 2A assumes that the JTAG serial chain formed by CROP device 210 and first in-system, circuit section 240a can operate in a JTAG test mode even while other parts of the end-use system 200/200' function in a normal operational mode. More specifically, the system is designed so that FPGA 220 can remain operational on its own or cooperate with a second, in-system circuit portion 240b while EE_NVIS array 214 is undergoing re-programming and verification. To this end, a mode control module 230 is provided with independent control outputs 231 and 232. Control output 231 selectively activates or deactivates the JTAG serial mode of in-system sections 210 and 240a. Control output 232 selectively and independently activates or deactivates the JTAG serial mode of in-system sections 220 and 240b. A periphery 227 of the FPGA device, as identified by a dashed outer portion of box 220 of FIG. 2A, represents the JTAG boundary scanning portion of FPGA device 220. The JTAG serial chains of the illustrated units may be driven simultaneously in series or in parallel in accordance with boundary scanning techniques known in the art.

A mode command line 235 within system 200/200' supplies appropriate mode command instructions to module 230 for putting one or the other or both of control lines 231 and 232 into test or operational modes. The second, in-system circuit section 240b may be coupled to in-system circuitry section 240a by way of operational coupling 246. Operational coupling 246 becomes active when both of in-system circuit sections 240a and 240b are in normal operational modes.

Given that FPGA 220 can remain functional and cooperative with the second in-system circuitry section 240b even while EE_NVIS array 214 is being re-programmed and verified, it should be apparent that down time for FPGA 220 and its associated circuitry 240b during FPGA reconfiguration can be kept to a minimum. The down time of FPGA 220 may be no more than the time it takes to output, pre-verified configuration instructions from EE_NVIS array 214 through internal link 216 and through serial interface 217 to the SRAM 225 by way of serial link 211. CROP rotation can take place while FPGA 220 and the second in-system circuitry section 240b remain on line and while CROP device 210 remains in-system.

Figure 2B:
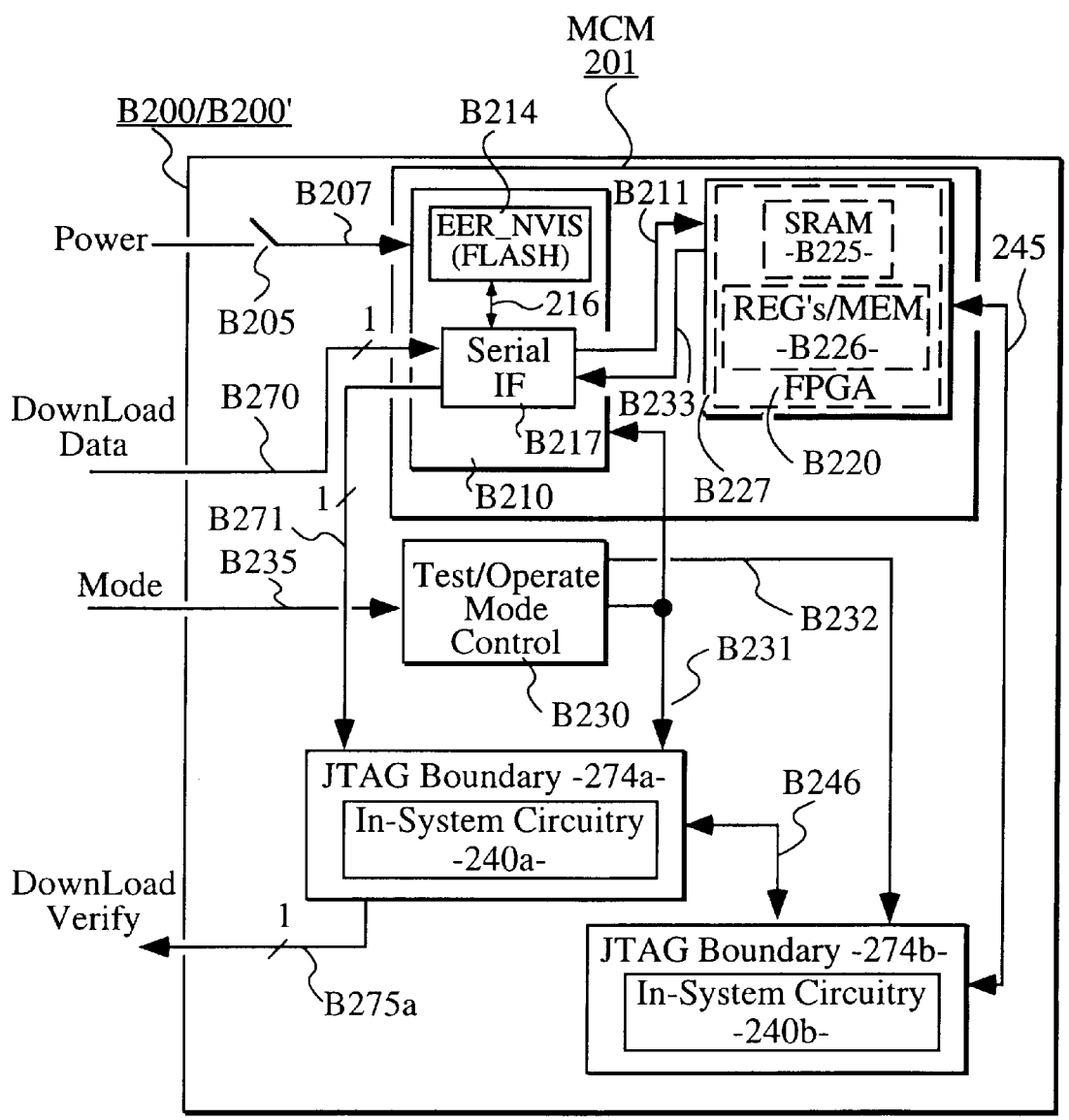
FIG. 2B is a third block diagram showing an MCM (Multi-Chip Module) embodiment of an in-system programmable and verifiable CROP/FPGA combination in accordance with the invention.

FIG. 2B is a block diagram showing an MCM (Multi-Chip Module) embodiment of an in-system programmable and verifiable CROP/FPGA combination in accordance with the invention. It is substantially the same as the embodiment of FIG. 2A with the exception that both of an integrated circuit substrate forming the ISPAV CROP device (B210) and an integrated circuit substrate forming the FPGA device (B220) are housed and intercoupled within a Multi-Chip Module (MCM) 201. Where practical, like reference symbols in the 'B200' century series are used for elements of FIG. 2B which correspond to those of FIG. 2A bearing numbers in the '200' century series. Element B226 represents configuration-time loadable, embedded memory within FPGA device B220. Line B233 carries JTAG or other serial test data out of FPGA device B220 for output through line B271. Serial interface circuit B217 has the ability to short-circuit FPGA device B220 out of the serial test data loop so that reprogramming and verification of EE_NVIS array B214 can take place even while FPGA device B220 remains in an operational mode wherein it cooperates with in-system circuitry section 240b.

An advantage of the MCM embodiment B200 is that greater compaction of circuitry is achieved by integrating units B210 and B220 into a single MCM package. A disadvantage is the cost of integrating two different kinds of fabrication process technologies (e.g., the FLASH technology of B214 and the SRAM technology of B225) into a single manufacturing line.

Figure 3:
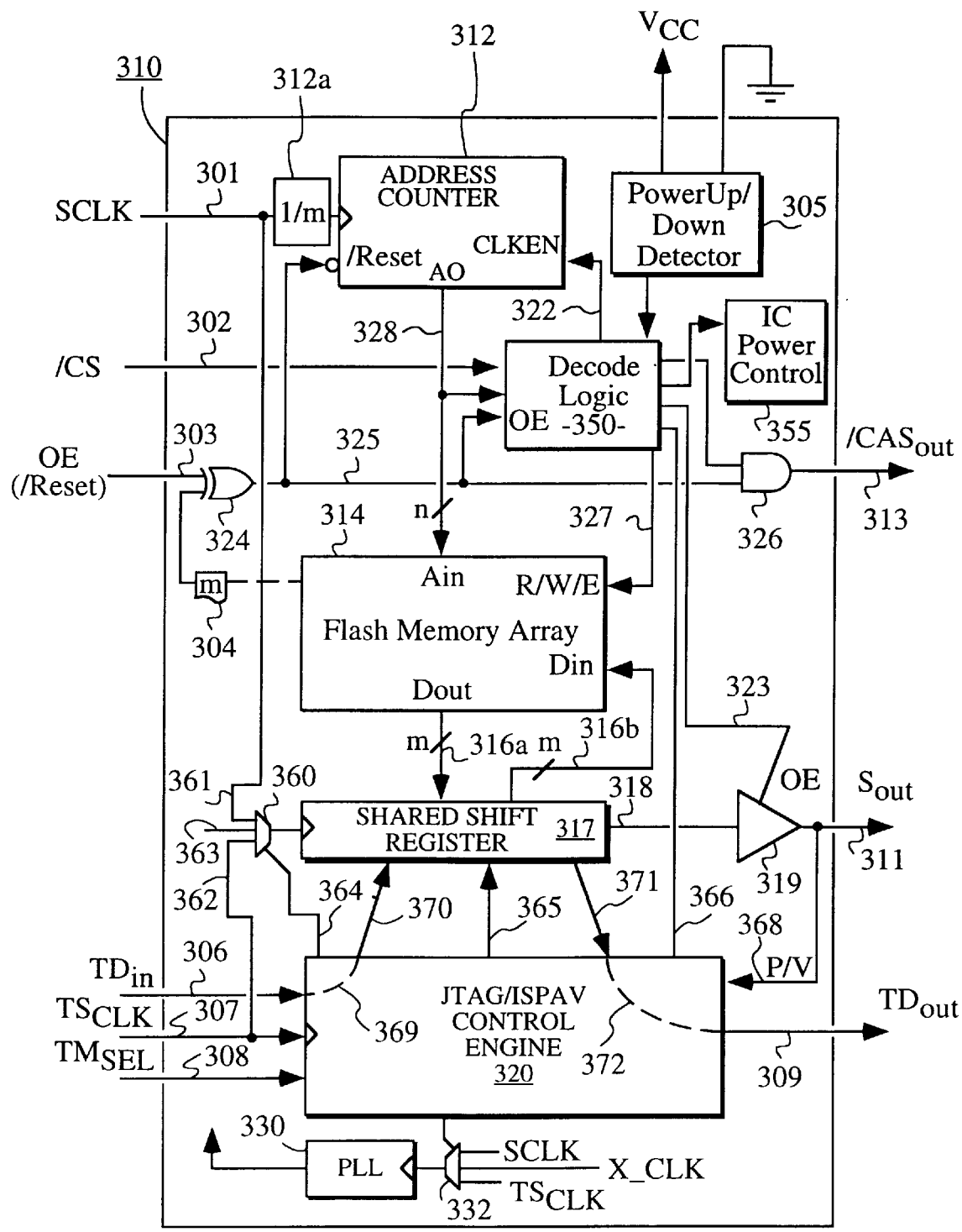
FIG. 3 is a schematic diagram illustrating one embodiment of an In-system Programmable and Verifiable (ISPAV), Configuration-Restoring On Power-up (CROP) device in accordance with the invention that uses Flash memory for its Electrically Erasable and reprogrammable, NonVolatile Integrated Storage (EE_NVIS)

Referring next to FIG. 3, details of a preferred architecture for an ISPAV CROP device 310 in accordance with the general structure 210 of FIG. 2A will be described. Where practical, like reference symbols in the '300' century series are used for elements of FIG. 3 which correspond to but are not necessarily the same a those of FIG. 2A bearing numbers in the '200' century series.

FIG. 3 is a schematic of an integrated circuit chip 310 formed using a monolithic semiconductor substrate or the like and having interface terminals 301–304, 306–309, 311, 313, Vcc and GND for communicating with circuitry outside of the substrate. Multi-substrate implementations such as MCM are of course, alternatively possible.

Integrated circuit 310 includes an on-chip, FLASH EE_NVIS array 314 having at least $2^n$ addressable storage locations that are respectively addressed by way of an n-bits wide, parallel, address-receiving input port Ain. An address sequencer or counter 312 that is also at least n-bits wide, is further provided in device 310 for driving the address-receiving input port, $A_{in}$ of the FLASH array 314. The integer n is preferably at least equal to 8 or more ($2^8$=256). The integer n is more preferably at least equal to 16 or more ($2^{16}$=65,536) and yet more preferably at least equal to 20 or more ($2^{20}$=1,048,576=1M). The specific value of n will vary depending on the storage depth and width configuration of the FLASH array 314. A 4 Mb FLASH array 314 for example, may be organized as $2^{20}$ storage words with each such individually-addressable storage word being 4 bits wide. Alternatively, a 4 Mb FLASH array may be organized as $2^{19}$ storage words with each such individually-addressable storage word being 8 bits wide. In yet another alternative embodiment, the 4 Mb FLASH array may be organized as $2^{18}$ storage words with each such individually-addressable storage word being 16 bits wide. In a further alternative embodiment, the 4 Mb FLASH array may be organized as $2^{17}$ storage words with each such individually-addressable storage word being 32 bits wide. Although memory array 314 is referred to herein according to its preferred technology, namely, FLASH; other forms of EE_NVIS such as EEPROM are of course also within the contemplation of the invention.

The addressable storage locations of FLASH array 314 are each at least m-bits wide and the data of an addressed one of such storage locations is output from a corresponding data output port, $D_{out}$ of the FLASH array 314. The integer m is preferably at least equal to 4 and more preferably at least equal to 8 or more and even more preferably at least equal to 16 or 32 or more. The specific value of m will vary depending on the storage depth and width configuration of the FLASH array 314. Larger values of m tend to reduce the rate at which address counter 312 needs to be clocked in order to achieve a desired output bandwidth (measured in bits per second, or b/S) from the FLASH array 314. Larger values of m also tend to increase the allowable, read latency of FLASH array 314 as measured from presentation of a valid address signal at the $A_{in}$ port (328) to the responsive output of correspondingly valid data at the $D_{out}$ port.

In one embodiment, the average output bandwidth from FLASH array 314 is at least about 12 Mb/S to 16 Mb/S, as measured in Megabits per second. This translates to an allowable read latency of no greater than about m times 80 nS (nanoseconds) to m times 62 nS. Naturally, as the integer m becomes larger, the read-time latency ceiling for FLASH array 314 advantageously becomes higher and higher.

The total data storage capacity of the FLASH array 314 should be at least 1 Mb (one Megabit, or 1,048,576 bits), and more preferably at least 2 Mb, and even more preferably at least 4 Mb or 8 Mb.

A clock divider 312a may be provided between SCLK line 301 and the clock input of address counter 312 for dividing SCLK by m or a larger value so that counter 312 steps after m or more pulses of SCLK have been delivered to a next-described, shared shift register 317. Clock divider 312a may provide a phase shifting function as well as a frequency changing function so that memory read operations can overlap in time with shift operations of the shared shift register 317. The divide and/or phase shift amounts provided by the clock divider 312a may be made user-configurable if desired, with the specific configuration being in-loaded via a below-described, 4-wire interface (306–309).

The shared shift register 317 is at least m-bits wide, and is additionally provided in device 310 so as to be coupled to receive a corresponding m-bits of data from the data output port, $D_{out}$ of the FLASH array 314. In one embodiment, data output port $D_{out}$ is an m-bits wide parallel output port and corresponding coupling 316a from data output port $D_{out}$ to shared shift register 317 is an m-lines wide parallel bus. Once m-bits of valid $D_{out}$ data are latched into register 317, the FLASH array 314 can begin altering the levels on its $D_{out}$ port (flipping to the temporary data invalid state) as a next memory fetch cycle begins. This means that memory access operations can occur contemporaneously with serial shift operations of the shared shift register 317.

The shared shift register 317 is further coupled to supply m-bits of data to a data input port $D_{in}$ of the FLASH array 314. In one embodiment, data input $D_{in}$ is an m-bits wide parallel input port and corresponding coupling 316b is an m-lines wide parallel bus. In the case where data output port, $D_{out}$ and data input port $D_{in}$ of FLASH array 314 are both m-bits wide parallel ports, data can be quickly transferred back and forth in parallel between the shared shift register 317 and the FLASH array 314. In an alternate embodiment, FLASH array 314 may have a single, bidirectional data port that transfers m-bits wide data in parallel for respective reading and writing operations.

A JTAG/ISPAV control engine 320 is further provided on chip 310. The JTAG/ISPAV engine 320 includes a first serial coupling 370 for serially loading data into the shared shift register 317 and a second serial coupling 371 for serially shifting data out of register 317. Link 365 controls the operating mode of the shared shift register 317. Link 366 provides coordination between operations of the JTAG/ISPAV engine 320 and a soon-described, decode logic section 350.

JTAG/ISPAV engine 320 includes a respective set of JTAG-compatible inputs: 306 ($TD_{in}$), 307 ($TS_{CLK}$) and 308 ($TM_{SEL}$) for respectively receiving serial test data input, a test subsystem clock, and test mode selection control signals. These inputs are sometimes alternatively referenced as TDIN, TCLK and TMS. JTAG/ISPAV engine 320 further includes a serial output 309 ($TD_{out}$) for outputting serial test data. The latter is sometimes alternatively referenced as TDOUT. The combination of TDIN, TCLK TMS and TDOUT may define a 4-wire interface. In an alternative embodiment, the interface of the four chip pins: 306, 307, 308 and 309 may be in accordance with serial scanning subsystems other than industry standard, JTAG protocols, where the alternate scanning subsystems may be as otherwise adopted by industry for implementing in-system testing. Such test subsystems are often generically referred to in the art as boundary scanning subsystems. In one embodiment, the data transfer rate of the 4-wire interface (306–309) is around 10 Mb/S or less. On the other hand, it could be larger.

A clock-selecting multiplexer 360 is further provided in device 310 for driving a clock input of the shared shift register 317. A serial clock input (SCLK) 301 of chip 310 couples to both the clock input of address counter 312 (via divider 312a) and a first selectable input 361 of the clock-selecting multiplexer 360. A second selectable input 362 of multiplexer 360 receives the $TS_{CLK}$ signal (307). Selection control terminal 364 of multiplexer 360 receives a selection control signal from JTAG/ISPAV engine 320 for determining whether the signal on first input 361 or on second input 362 should be selectably applied to the clock input of the shared shift register 317. Clock-selecting multiplexer 360 may have further selectable inputs, if desired, such as 363 for driving the shared shift register 317. One possibility is to receive alternate clock signals on input 363 from an on-chip phase locked loop (PLL), which unit is shown at 330. PLL unit 330 may lock onto external clocks such as SCLK, $TS_{CLK}$ or others (X_CLK) and may operate at a different frequency as may be desired for clocking shared shift register 317 at a given time interval. Multiplexer 332 is shown supplying these various external clock signals to PLL 330 with selection being under control of the JTAG/ISPAV engine 320. The clock multiplying and phase shifting characteristics of PLL unit 330 may also be under control of the JTAG/ISPAV engine 320.

The JTAG/ISPAV control engine 320 asserts selection control signals onto control terminal 364 in accordance with mode instructions provided by received test mode selection control signals 308 and/or further mode controls supplied from decode logic section 350 by way of bus 366.

An active-low, chip-select signal (/CS) 302 is supplied by one of the external pins of chip 310 to chip-internal decode logic 350. When signal 302 is active (low), it causes decode logic circuit 350 to apply an active clock-enable signal (CLKEN) 322 to address counter 312. This enables address counter 312 to begin counting in synchronism with the SCLK signal of terminal 301.

When the ICS signal 302 is inactive (high), address counter 312 is disabled from counting. An inactive (high) /CS signal 302 also causes decode logic 350 to place an output 311 of an on-chip, tristate output driver 319 into a high impedance output mode. This is accomplished by way of output-enable (OE) line 323. The inactive (high) state of /CS signal 302 also causes decode logic 350 to send a standby mode signal to IC power control section 355. Power control section 355 then responsively puts the IC chip 310 into a low power (low $I_{CC}$) standby mode.

Output-enable pin 303 (OE/RST) of the IC is a dual function pin with programmable polarity. Exclusive OR gate 324 receives the OE/RST signal at a first input and determines which of the dual functions: OE and RST (Reset) will be active high while the other is active low. Non-volatile memory bit 304 connects to a second input of exclusive OR gate 324 to determine polarity. A logic '0' on output line 325 of the exclusive OR gate resets the address counter 312 and forces line 323 (tristate OE) into an output disabled mode, which then forces tristate driver 319 into the high impedance output mode. A logic '1' on control line 325 permits the address counter 312 to count and also permits (but does not necessarily cause) line 323 to go into an active output-enable mode. The /CS line 302 needs to be also active for line 323 (OE) to go into an active output-enabling mode.

A logic '0' on control line 325 also forces AND gate 326 to output an active-low, cascading signal /$CAS_{out}$ onto line 313. The /$CAS_{out}$ signal (313) may be coupled to the /CS input (302) of a second CROP device such as 310.

The /$CAS_{out}$ line 313 also may go into an active low state when decode logic section 350 detects that address counter 312 has reached a maximum value. The next CROP device in a cascaded daisy chain (if any) is thereby informed that the data space of FLASH array 314 in the present chip 310 has been exhausted and the next CROP device may begin to output the respective configuration data of its address space.

The serial output ($S_{out}$) pin 311 of the integrated circuit chip 310 corresponds to line 211 of FIG. 2A. The output of tristate driver 319 is placed in the high impedance mode if either of ICS or /(OE/RST) is inactive. During programming and verification of the FLASH array 314, pin 311 may be used to place the chip in one of the program or verify modes (P/V). This second use of pin 311 is indicated by input path 368 linking into JTAG/ISPAV engine 320.

Control line 327 (emanating from decode logic 350) may be used to place the FLASH array 314 in the appropriate one of a read mode, a write mode, and an erase mode (R/W/E). FLASH-technology based erasing allows the non-volatile memory cells of array 314 to be quickly erased prior to programming.

During programming of the FLASH array 314, the new data is introduced into the chip by way of $TD_{in}$ pin 306 in synchronism with the test subsystem clock on line 307. Dashed path 369 indicates the transmission of the serial data during the programming mode into serial link 370 for temporary storage in the shared shift register 317. The serially-introduced new data is then parallel loaded into the $D_{in}$ data input of FLASH array 314 by way of path 316b. During programming, multiplexer selection control 364 selects input 362 so that the shared shift register operates in synchronism with the clock on line 307. (Alternatively, input 363 could be selected if the PLL 330 is then operating in synchronism with the $TS_{CLK}$ clock signal on line 307.) SCLK 301 advances address counter 312 to a next address at the completion of each write operation. (Alternatively, PLL 330 could be used to control advancement of address counter 312 in synchronism with $TS_{CLK}$ but at a frequency which is much lower.)

During verification (after programming), the address counter 312 is reset and its count output 328 is incremented in synchronism with the SCLK signal on line 301. The corresponding data output ($D_{out}$) of the FLASH array 314 is loaded via bus 316a into shared shift register 317. Then, the same data is serially off-loaded in synchronism with the test subsystem clock (307) by way of serial path 371 to test data output pin 309. Dashed line 372 represents the serial passage of this data through the JTAG/ISPAV engine 320 during the verification mode. As with programming, the shared shift register 317 should be serially shifting its data at a rate that is faster than that of the address advancing clock 301 applied to address counter 312.

Figure 4:
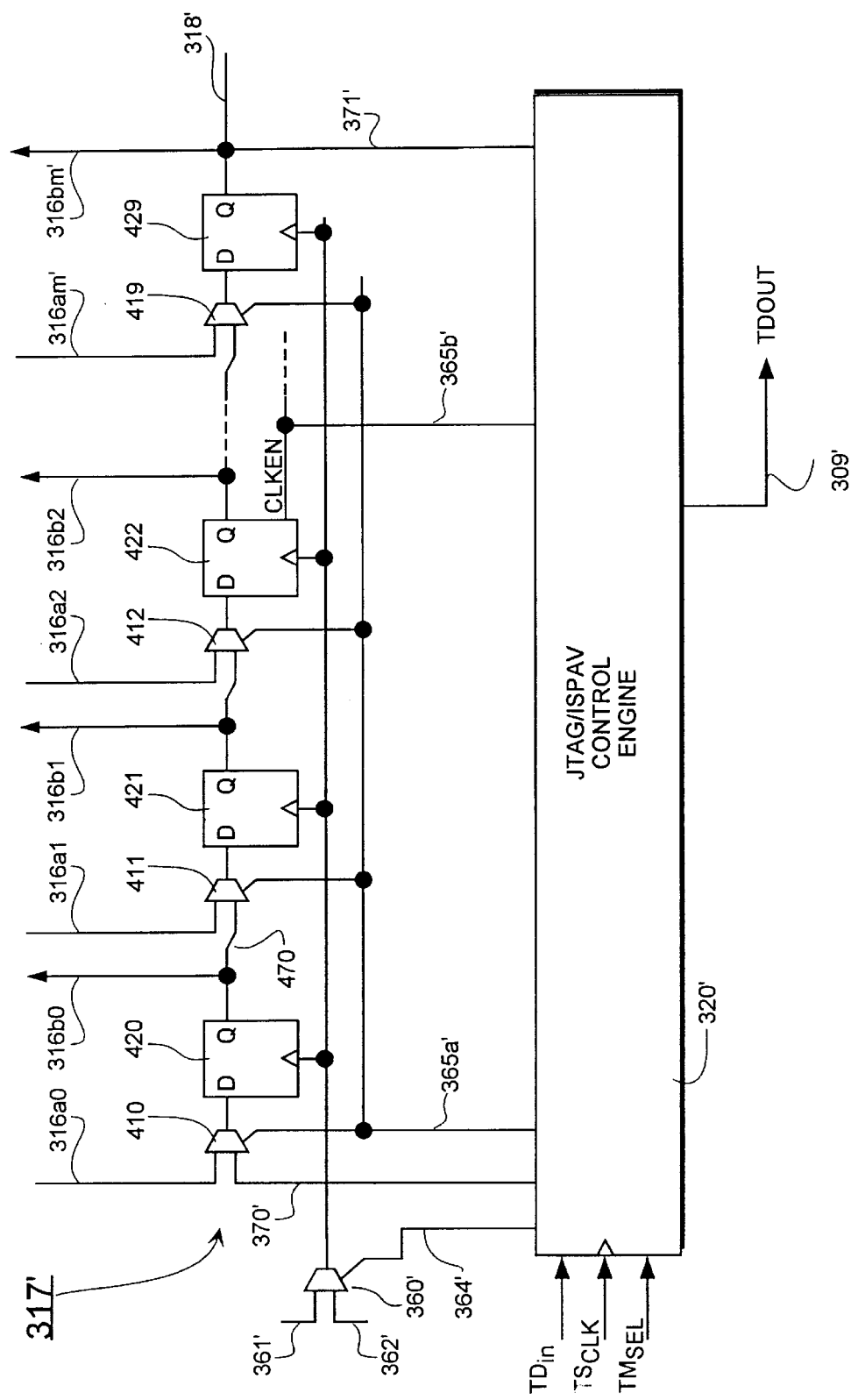
FIG. 4 is a schematic diagram illustrating one embodiment of a shared shift register that may be used in the ISPAV CROP device of FIG. 3.

FIG. 4 is a schematic of one implementation 317' of the shared shift register of FIG. 3. Implementation 317' allows for both serial and parallel inputting and outputting of data by way of the shared shift register. Where appropriate, similar reference numbers corresponding to elements in FIG. 3 are used in FIG. 4. Thus, JTAG/ISPAV engine 320' operates selection control terminal 364' of multiplexer 360' to select one of the clock signals on lines such as 361' and 362'. (Optional input 363' is not shown to avoid illustrative clutter.) Serial data is transferred by way of line 370' into the shared shift register 317' from the JTAG/ISPAV engine 320'. Serial data is transferred by way of line 371' from the shared shift register 317' to the JTAG/ISPAV engine 320'.

The illustrated implementation of shared shift register 317' includes a plurality of D-type registers, 420, 421, 422, . . . , 429 and a corresponding plurality of D-feeding multiplexers 410, 411, 412, . . . , 419. The number of such D-type registers 420–429 and D-feeding multiplexers 410–419 is at least the same as m (or m'+1) so that data may be parallel transferred between register 317' and the m-bits wide data ports ($D_{IN}$ and $D_{OUT}$) of FLASH array 314.

Referring to D-feeding multiplexer 410, a first selectable input receives serially-transferred data such as from line 370' while a second selectable input receives parallel-wise transferred data such as from line 316a0. The signal on line 316a0 represents a corresponding bit from the $D_{out}$ port of FLASH array 314. Control line 365a' carries a data-flow control signal from JTAG/ISPAV engine 320' for directing the D-feeding multiplexer 410 and the subsequent D-feeding multiplexers 411–419 to each select either the serially-transferred data or the parallel-wise transferred data for feeding into the D input of a respective one of D-type registers 420–429. Line 470 carries the serially-transferred data for D-feeding multiplexers 411. Control line 365b' carries a clock-enable control signal from JTAG/ISPAV engine 320' to all of D-type registers 420–429 for selectively enabling the responsiveness of the D-type registers 420–429 to the clock signal output by clock selector 360'. The JTAG/ISPAV engine 320' actuates control lines 365a' and 365b' in accordance with the respective modes of operation desired at each given moment.

The Q output of each of D-type registers 420–429 couples by way of a corresponding one of parallel bus lines 316b0–316bm' to the Din port of FLASH array 314. The bit significance of 316b0–316bm' and 316a0–316am' can of course, run low-to-high or high-to-low depending on the shift protocol used by the boundary scanning circuits.

The Q output of each of D-type registers 420 through, but not including, 429 also couples to the next succeeding D-feeding multiplexer as shown. The Q output of the last D-type register 429 of the string drives the input 318' of the $S_{OUT}$ line driver 319 (FIG. 3). It also drives line 371'.

Other implementations for the shared shift register are of course possible based on other types of registers (e.g., JK, T, etc.). It is understood that one of the decode logic section 350 and JTAG/ISPAV engine 320 can also otherwise drive common controls of the registers 420–429 such as clock-enable (365b'), set and reset (not shown) as deemed appropriate.

Figure 5:
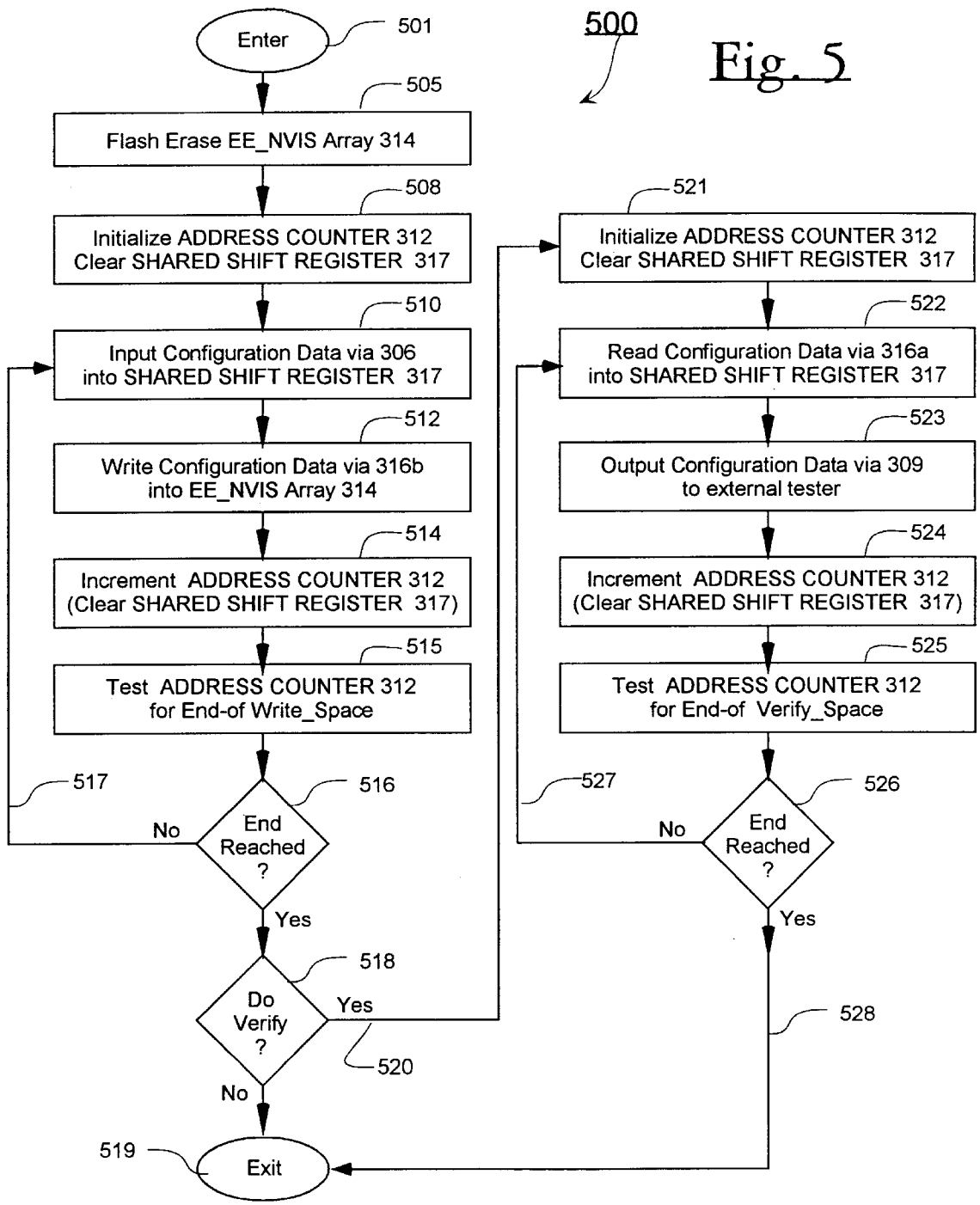
FIG. 5 is a flow chart showing a CROP rotation method in accordance with the invention.

Referring to FIG. 5, a reconfiguration method 500 in accordance with the invention comprises the following steps. Entry is made at step 501. At step 505 the FLASH EE_NVIS array 314 of FIG. 3 is FLASH-erased. At step 508 the address counter 312 is initialized either by resetting or by otherwise establishing an initial address in the counter 312. Shared shift register 317 is also cleared.

In step 510, configuration data corresponding to the present address of counter 312 is input into shared shift register 317 by way of the $TD_{in}$ link 306 in synchronism with the TSCLK clock on line 307. At step 512 the input configuration data is written into the FLASH EE_NVIS array 314 via parallel connection 316b. At step 514 the address counter 312 is incremented by strobing the SCLK line 301. If desired, shift register 317 may also be cleared at this time as a precaution.

At step 515 the address in the address counter is tested to detect an end-of-write_space condition (meaning that the last location intended to be written into array 314 has been written into). If the last location had not yet been written into, then at step 516 control is returned to step 510 by way of looping path 517.

If the answer is yes at step 516, control passes to step 518 wherein it is determined whether verification of the written data is desired. If the answer is no, an exit is taken at step 519. If the answer is yes, path 520 is followed to step 521. In step 521 the address counter 312 is re-initialized to a verification start address. This can be done by resetting the address counter 312 or loading a verification start address by other means (e.g., shifting in a start address from line 306, through JTAG/ISPAV control engine 320 and into counter 312 by way of an initializing path, not shown in FIG. 3). As a precaution in step 521, the shared shift register 317 may be cleared.

At verification step 522, pre-written configuration data is transferred from FLASH EE_NVIS array 314 into shift register 317 by way of parallel path 316a. Once valid-read data is latched into the shared shift register 317, a next memory-address and data-read operation may begin even while register 317 is shifting out previous data.

At verification step 523, the $TS_{CLK}$ clock (307) is used to shift the read-and-latched data from register 317 by way of paths 371, 372 to an external testing system, where the external testing system (not shown) is coupled to $TD_{out}$ pin 309. The external testing system may then be used to compare the data read out from FLASH EE_NVIS array 314 against an expected value and to thereby determine whether programming had properly occurred for the current address (328) now being output by address counter 312.

At verification step 524, the SCLK line 301 is strobed to increment address counter 312 to the next address. At step 525 the next address is tested against a prespecified end-of-verify_space value or count. If the end of the verification space has not yet been reached, step 526 returns control to step 522 by way of looping path 527. The partial loop of steps 524, 525, 526 plus the beginning of 522 may be carried out simultaneously with the execution of shift-out step 523.

If at step 526 it is determined that the end of the verification space has been reached, path 528 is followed to exit point 519. Reconfiguration of the FPGA device 220 may then follow in a subsequent power-up sequence or in another reconfiguration sequence as desired.

FIGS. 6A–6C illustrate various small-footprint packagings that may be used for CROP device 310 of FIG. 3. The 14-pin dual-inline packaging (DIP) of FIG. 6A places VCC and GND in the standard pin 14 and pin 7 positions. The serial output data (311) is provided at pin 1. NC represents an unused pin. If desired, other functionalities may be provided by way of unused pins 8, 10 and 13.

FIG. 6B illustrates a 20-pin dual-inline implementation for the packaging of the CROP device. Here, VCC and GND are positioned at the traditional pin 20 and pin 10 positions. The serial output data (311) is provided at pin 2. Additional functionalities may be provided by way of the unused pin positions: 1, 5, 9, 11–13, 15–16 and 19, as desired.

FIG. 6C is a top plan view of an alternate four-sided packaging for the CROP device using a standard 20-pin PLCC format. Other small-footprint formats are also within the contemplation of the invention, including single in-line packaging schemes.

Figure 7:
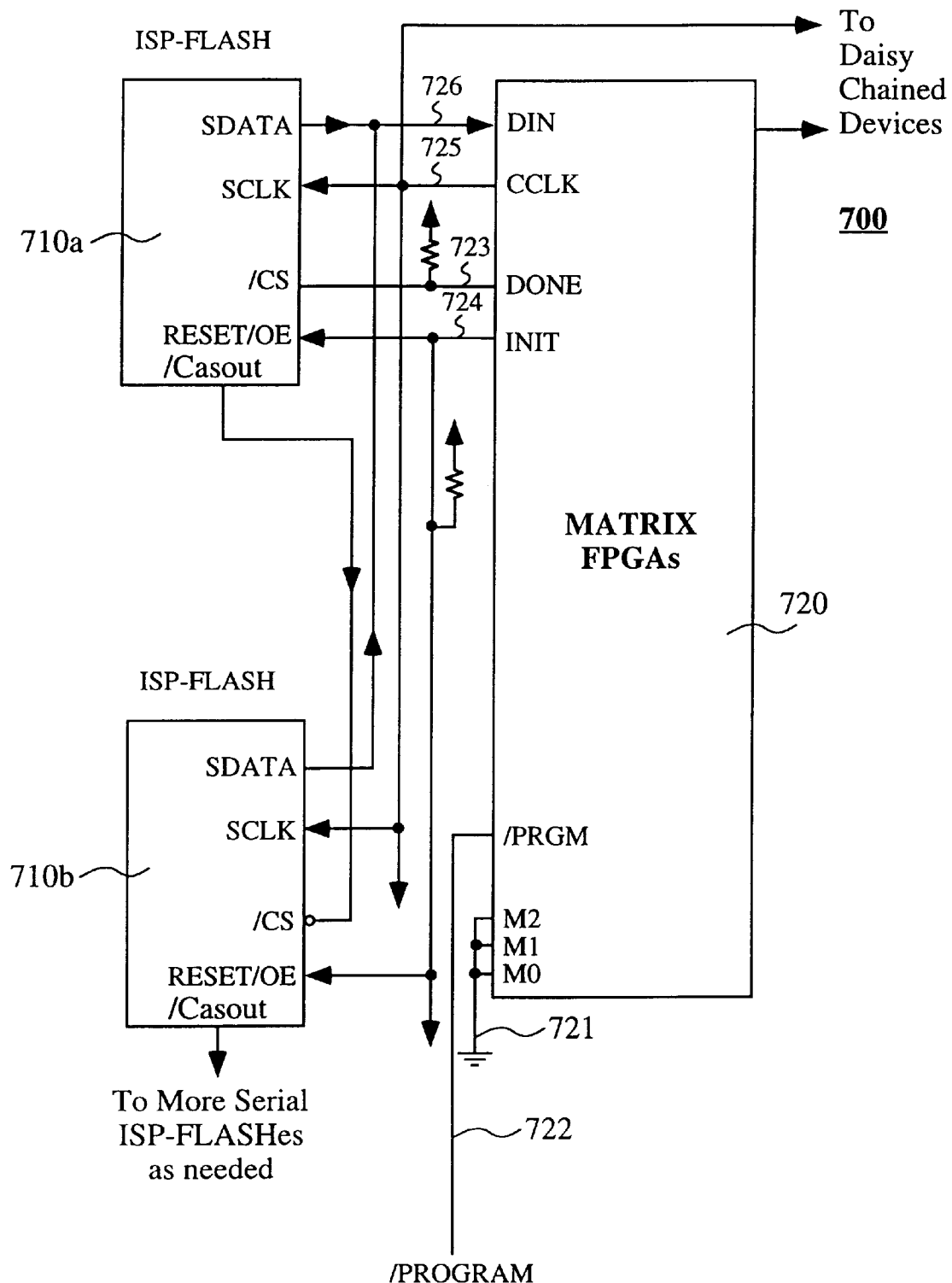
FIG. 7 is a schematic diagram illustrating a first system with cascaded CROP devices of the invention.

FIG. 7 illustrates a daisy-chain system 700 in which FPGA device 720 may be programmed by a series of ISPAV CROP devices 710a, 710b, etc., where one or more of the CROP devices 710a, 710b, etc., is in accordance with the design of FIG. 3.

FPGA device 720 has a plurality of configuration-mode pins M0, M1 and M2 for establishing different configuration modes. When M0–M2 are all low, as indicated by grounding 721, FPGA device 720 is in a so-called master serial configuration mode.

Pin 722 (/PRGM) is a dedicated input pin of device 720 which in a low level (logic 0) clears the entire configuration memory of FPGA device 720 and puts device 720 is a WAIT state, ready to receive new configuration instructions. Transition to a high level on pin 722 starts an initialization and configuration process. If pin 722 is high during a power-up sequence, FPGA device 720 automatically clears its configuration memory and goes into a configuration restoration mode.

DONE pin 723 is a dedicated open collector pin which indicates with a low output that FPGA device 720 is in a configuration mode. A high output on pin 723 indicates that configuration is done and device 720 is ready to enter into a normal operational mode. The open-collector nature of DONE pin 723 allows multiple FPGA devices (720) to come on line in synchronism by tying the DONE pins of these FPGA devices together. The INIT pin 724 of the FPGA device has an open-collector output state in which FPGA device 720 may serve as a master for simultaneously beginning configuration of one or more slave FPGA devices (not shown). As seen, the reset/OE inputs of CROP devices 710a, 710b, are coupled to the INIT pin 724 of the FPGA device.

FPGA device 720 includes an internal clock oscillator (not shown) that may be configurably coupled to CCLK clock pin 725 when the FPGA device is in master mode. If FPGA device 720 is in slave mode, the CCLK pin 725 functions as an input pin for receiving a synchronizing clock from another device. As seen in FIG. 7, the FPGA device 720 is in master mode and the CCLK pin 725 outputs synchronizing clock signals to the SCLK inputs of CROP devices 710a, 710b, etc.

DIN pin 726 is a multiplex IO pin of FPGA device 720. During configuration, DIN pin 726 functions as an input for receiving serial data from a configuration-defining device. After configuration is complete, pin 726 may be used for user-I/O provided the user can avoid contention problems. This can be done because the SDATA pins of the CROP devices 710a, 710b, etc., switch into a high impedance mode after configuration completes.

Figure 8:
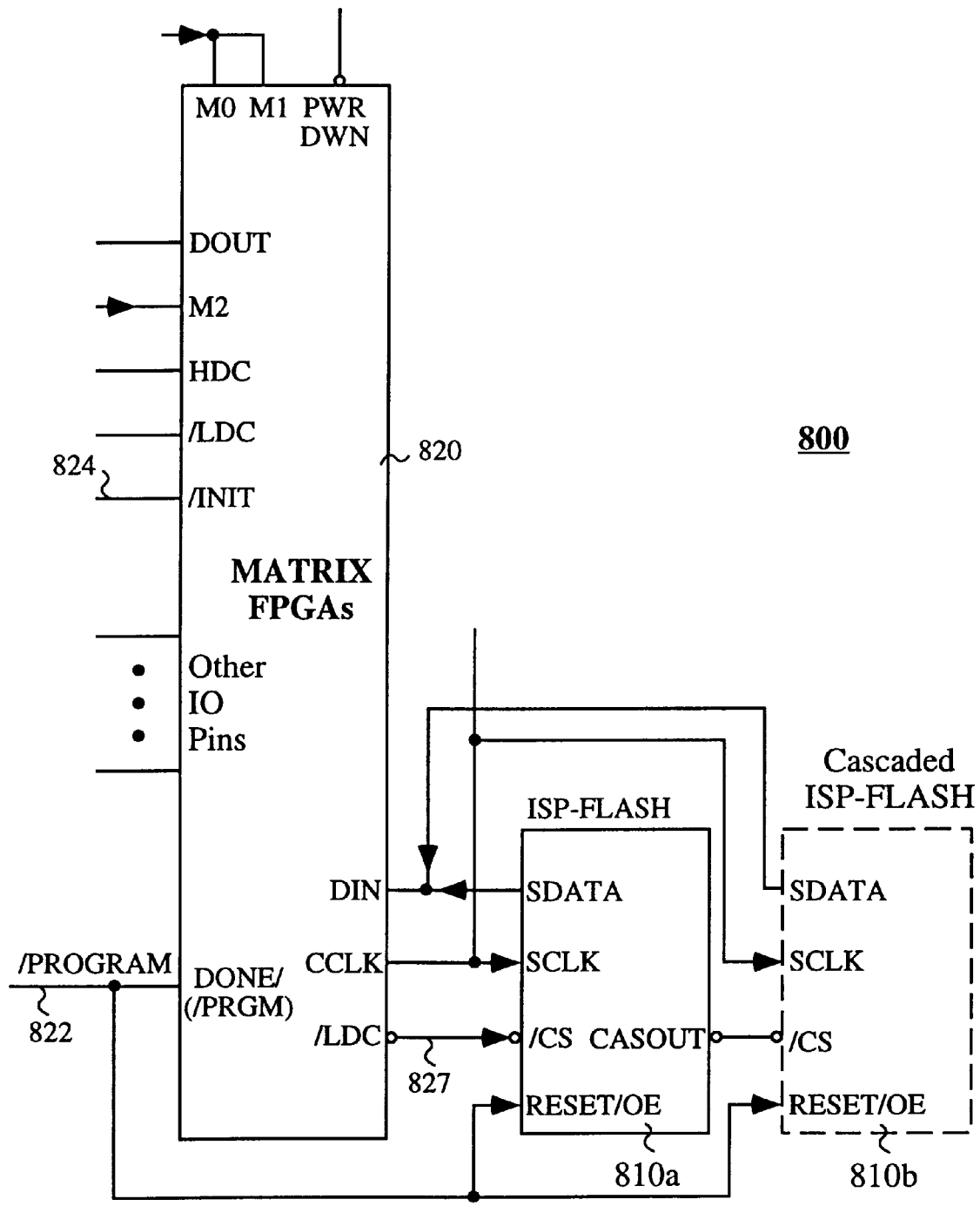
FIG. 8 is a schematic diagram illustrating a second system with cascaded CROP devices of the invention.

FIG. 8 shows an alternate system 800 in which /PROGRAM line 822 drives the RESET/OE inputs of ISPAV CROP devices 810a, 810b, etc. /LDC pin 827 is a multiplexed IO pin of FPGA device 820 which goes low during configuration. As seen, in system 800, the /LDC pin 827 is used to drive the /CS pin of first CROP device 810a.

The above disclosure is to be taken as illustrative of the invention, not as limiting its scope or spirit. Numerous modifications and variations will become apparent to those skilled in the art after studying the above disclosure.

By way of example, in a multi-chip module (MCM) embodiment such as that of FIG. 2B, the pins of one of FIGS. 6A–6C may be added correspondingly to the MCM package in combination with pins of the associated FPGA B220 to provide the combined device, MCM 201 having only a few more pins than that of FPGA B220 taken alone. Pins VCC, GND of FIGS. 6A–6C may be left out from the MCM combination since FPGA B220 has such power pins already. Pin SDATA of FIGS. 6A–6C may be further left out from the MCM combination since the serial-out function (311) is to be carried out internally within the MCM package. PIN SCLK of FIGS. 6A–6C may be further left out from the MCM combination if FPGA B220 already has such a clock receiving or producing node.

By way of further example of alternatives, it should be noted that although the above discussion has been directed specifically reconfiguration of FPGA's with volatile configuration memories, it is possible to have other kinds of volatilely-configured PLD's such as CPLD's with volatile configuration memories and to use the Configuration-Restoring On Power-up principles described above for supporting in-system programming and verification of such other, volatilely-configured, Programmable Logic Devices.

Given the above disclosure of general concepts and specific embodiments, the scope of protection sought is to be defined by the claims appended hereto.

What is claimed is:

1. A configuration restoring device for providing configuration instructions to an external to-be-configured device, said restoring device comprising an integrated circuit chin incorporating:
   (a) an electrically erasable and reprogrammable, nonvolatile integrated storage array (EE-NVIS array) for storing configuration instructions; and
   (b) a serial interface circuit, wherein the serial interface circuit includes:
      (b.1) a first, bidirectional coupling to the EE-NVIS array by way of which configuration instructions can be bidirectionally transferred between the EE-NVIS array and the serial interface circuit;
      (b.2) a first serial output by way of which configuration instructions can be serially output to the to-be-configured device; and
      (b.3) a serial input by way of which configuration instructions can be input to the serial interface circuit for subsequent transfer by way of the first, bidirectional coupling from the serial interface circuit to the EE-NVIS array for storage in said EE-NVIS array, whereafter the stored configuration instructions can be transferred by way of the first bidirectional coupling from the EE-NVIS array and serially through the first serial output to said external, to-be-configured device.

2. The configuration restoring device of claim 1 wherein the EE_NVIS array includes:
   (a.1) FLASH memory cells.

3. The configuration restoring device of claim 1 wherein said tristateable first serial output connects to a P/V control line that can function to place the integrated circuit chip in one of program and verify modes when the first serial output is in a high-impedance mode.

4. The configuration restoring device of claim 1 wherein the EE_NVIS array includes:
   (a.1) single-transistor memory cells each capable of storing at least one logic bit.

5. The configuration restoring device of claim 4 wherein said single-transistor memory cells are each capable of storing plural logic bits.

6. The configuration restoring device of claim 1 wherein the EE-NVIS array is programmable and erasable with a monopolarity power supply voltage of about 5 Volts or less.

7. The configuration restoring device of claim 1 wherein the serial interface circuit further includes:
   (b.4) a second serial output by way of which data stored in the EE-NVIS array can be serially output for verification, said for-verification data moving from the EE-NVIS array and through said first bidirectional coupling prior to being serially output for verification by way of the second serial output.

8. The configuration restoring device of claim 7 wherein:
   (b.4a) the combination of the first serial input and the second serial output are embeddable within a serial shift chain for serially continuing transmission of data through the serial shift chain.

9. The configuration restoring device of claim 8 wherein the serial shift chain is a JTAG-compatible testing chain.

10. The configuration restoring device of claim 1 wherein the to-be-configured device includes a field programmable, Programmable Logic Device (PLD) with a volatile configuration memory of at least one million configurable bits and the EE_NVIS array has sufficient storage capacity to store all configuration instructions that are loadable into said configuration memory.

11. The configuration restoring device of claim 1 wherein:
the to-be-configured device further includes both a volatile configuration memory and initially-configurable registers where said combination of volatile configuration memory and configurable registers includes more than one million configurable bits; and
the EE_NVIS array has sufficient storage capacity to store all configuration instructions that are loadable into both the volatile configuration memory and the initially-configurable registers of said to-be-configured device.

12. The configuration restoring device of claim 1 wherein:
the to-be-configured device includes both a volatile configuration memory and volatile embedded memory that may be initially loaded with data where said combination of volatile configuration memory and volatile embedded memory includes more than two million configurable bits; and
the EE_NVIS array has sufficient further storage capacity to store all configuration instructions that are loadable into both the volatile configuration memory and the into the embedded memory of said to-be-configured device.

13. The configuration restoring device of claim 1 further comprising within said integrated circuit chip:
(c) a power-up detecting interface, operatively coupled to said serial interface circuit, for detecting a power-up sequence and for responsively initiating a transfer of stored configuration instructions from the EE-NVIS array to the first serial output by way of the serial interface circuit.

14. The configuration restoring device of claim 13 further comprising:
(d) a protective packaging having no more than 20 terminals for providing electrical connections between interior and exterior portions of the protective packaging,
(d.1) wherein the protective packaging houses said EE_NVIS array, said serial interface circuit, and said power-up detecting interface, and
(d.2) wherein the no more than 20 terminals include:
(d.2a) a first terminal for carrying power into the interior portion of the protective packaging,
(d.2b) a second terminal by way of which said configuration instructions can be serially output from the first serial output to the to-be-configured device; and
<(d.2c) a third terminal by way of which said configuration instructions can be input to the serial interface circuit for subsequent transfer to EE_NVIS array.

15. The configuration restoring device of claim 1 wherein:
(a.1) said memory cells of the EE-NVIS array can be erased by a Fowler-Nordheim tunneling mechanism and thereafter reprogrammed, said erase and reprogramming cycle being repeatable at least 10,000 times over device lifetime.

16. The configuration restoring device of claim 3 wherein:
(a.1a) said erase and reprogramming cycle is repeatable at least 100,000 times over device lifetime.

17. The configuration restoring device of claim 1 wherein said first bidirectional coupling comprises:
(b.1a) at least 16 lines for parallel data transfer.

18. The configuration restoring device of claim 1 wherein said first serial output is tristateable.

19. A configuration restoring device comprising in a protective packaging:
(a) an Electrically Erasable and reprogrammable, Non-Volatile Integrated Storage (EE-NVIS) array for non-volatilely storing configuration restoring data in addressable locations;
(b) an addressing sequencer for sequencing the EE-NVIS array through a set of said addressable locations;
(c) a shared shift register that is bidirectionally coupled to the EE-NVIS array for receiving and storing data read out from the EE-NVIS array and for writing configuration restoring data into the EE-NVIS array, the shared shift register being further coupled to serially shift out data stored in the shared shift register; and
(d) a control engine, operatively coupled to the shared shift, for loading configuration restoring data into said shift register from a serial shift chain.

20. The configuration restoring device of claim 19 wherein the EE_NVIS array includes:
(a.1) FLASH memory cells.

21. The configuration restoring device of claim 19 wherein:
(a.1) memory cells of the EE_NVIS array can be erased by a Fowler-Nordheim tunneling mechanism.

22. The configuration restoring device of claim 19 wherein the EE-NVIS array has an address-receiving input port and the addressing sequencer includes:
(b.1) a clock input for receiving a sequencing clock signal; and
(b.2) a counter capable of sequencing through the addressable locations of the EE-NVIS array in periodic synchronism with said sequencing clock signal, said counter having a count output operatively coupled to the address-receiving input port $A_{in}$ of the EE-NVIS array.

23. The configuration restoring device of claim 22 wherein:
(c.1) the shared shift register has a shared clock input driven by a clock selector and the clock selector is controllable to selectively provide to the shared clock input either said sequencing clock signal or another of one or more alternatively selectable clock signals.

24. The configuration restoring device of claim 23 wherein:
(d.1) the control engine is operative in synchronism with a test subsystem clock of the serial shift chain; and
(c.2) the test subsystem clock is one of said alternatively selectable clock signals that can be selectively provided to the shared clock input of the shared shift register.

25. The configuration restoring device of claim 24 wherein:
(d.2) the control engine is responsive to a test modes selecting control signal of the serial shift chain; and
(d.3) the control engine supplies clock selection control signals to control the selection made by the clock selector in accordance with a mode selected by said test modes selecting control signal.

26. The configuration restoring device of claim 15 wherein said shared shift register comprises:

(c.1) a parallel input bus for receiving in parallel said data read out from the EE_NVIS array; and (c.2) a parallel output bus for outputting in parallel said configuration restoring data that is to be written into the EE_NVIS array.

27. The configuration restoring device of claim 26 wherein said shared shift register further comprises:

(c.3) a serial input line by way of which the control engine can serially load said configuration restoring data into said shift register from the serial shift chain.

28. The configuration restoring device of claim 15 wherein at least the EE_NVIS array, the addressing sequencer, and the shared shift register are provided within a same integrated circuit.

29. The configuration restoring device of claim 15 further comprising:

(e) a three-state output driver having an input coupled to receive the serially shifted out data from the shared shift register and an output that may be switched into a high-impedance state.

30. The configuration restoring device of claim 29 further comprising:

(f) a device selecting input; and (g) decoding logic responsive to the device selecting input and coupled to control said three-state output driver;

wherein the decoding logic switches the output of the three-state output driver into the high-impedance state when a device deselecting signal is applied to said device selecting input.

31. The configuration restoring device of claim 30 further wherein:

(g.1) said decoding logic is coupled to the addressing sequencer;

wherein the decoding logic switches the addressing sequencer into an inactive mode when said device deselecting signal is applied to the device selecting input.

32. The configuration restoring device of claim 19 wherein the EE_NVIS array includes:

(a.1) single-transistor memory cells each capable of storing at least one logic bit.

33. The configuration restoring device of claim 19 wherein:

(a.1) the EE-NVIS array is organized to output in parallel an addressed one of $2^n$ storage words where the output storage word is m bits wide, m is an integer equal to or greater than 4, and n is an integer equal to or greater than 16;

(c.1) said shared shift register is organized to receive in parallel at least one of said output storage words from the EE-NVIS array; and (b.1) said addressing sequencer is adapted for sequencing the EE-NVIS array through said $2^n$ storage words.

34. The configuration restoring device of claim 33 wherein:

(a.1a) m is an integer equal to or greater than 8 such that each output storage word is at least 8 bits wide.

35. The configuration restoring device of claim 33 wherein:

(a.1a) n is an integer equal to or greater than 20 such that there are at least 1,048,576 addressable storage words.

36. The configuration restoring device of claim 33 wherein:

(a.1a) m is an integer equal to or greater than 16 such that each output storage word is at least 16 bits wide.

37. The configuration restoring device of claim 33 wherein:

(a.1a) n is an integer equal to or greater than 16.

38. A configuration restoring device for providing configuration instructions to an external to-be-configured device, said restoring device comprising an integrated circuit chip incorporating:

(a) an electrically erasable and reprogrammable, nonvolatile integrated storage array (EE-NVIS array) having FLASH memory cells for storing configuration instructions;

(b) a JTAG interface circuit by way of which configuration instructions can be synchronously transferred into said integrated circuit for in-system programming of the EE-NVIS array; and (c) a serial output circuit by way of which configuration instructions can be transferred from the EE-NVIS array and synchronously out in serial manner to said external to-be-configured device, the serial output circuit and JTAG interface circuit being sufficiently independent of one another such that the synchronous transfer rate of the serial output circuit can be independent of the synchronous transfer rate of the JTAG interface circuit.

39. A configuration restoring device according to claim 38 wherein said FLASH memory cells can store at least 2 Megabits (2 Mb) of data.

40. A configuration restoring device according to claim 38 wherein said JTAG interface circuit further provides a means by way of which data programmed into the EE_NVIS array may be extracted from the EE_NVIS array for an in-system verification.

41. A method for providing in-system programming and verification of a configuration restoring device, wherein the configuration restoring device is defined within an integrated circuit as at least comprising:

(a) an electrically erasable and reprogrammable, nonvolatile integrated storage array (EE-NVIS array) for storing configuration instructions; and (b) a serial interface circuit, wherein the serial interface circuit has:

(b.1) a first, bidirectional coupling to the EE-NVIS array by way of which configuration instructions can be bidirectionally transferred between the EE-NVIS array and the serial interface circuit;

(b.2) a first serial output by way of which configuration instructions can be serially output to a to-be-configured device;

(b.3) a serial input by way of which configuration instructions can be input from a source outside the integrated circuit to the serial interface circuit for subsequent transfer by way of the first, bidirectional coupling from the serial interface circuit to EE-NVIS array; and (b.4) a second serial output by way of which data can be serially output from the serial interface circuit to a destination outside the integrated circuit for verification;

said programming and verification method comprising the steps of:

(c) first shifting configuration instructions from a source outside the integrated circuit into the serial input of the serial interface circuit;

(d) first transferring by way of the bidirectional coupling, the shifted-in configuration instructions into the EE-NVIS array for storage in the EE-NVIS array;

(e) second transferring by way of the bidirectional coupling, stored data from the EE-NVIS array to the serial interface circuit; and (f) second shifting the stored data transferred by said second transferring step to the second serial output for verification of said stored data by a verifier located outside the integrated circuit.

42. The in-system programming and verification method of claim 41 wherein said serial interface circuit further includes:

(b.5) a shared shift register coupled to the EE-NVIS array by way of said bidirectional coupling for parallel-wise transferring data between the EE-NVIS array and the shift register, (b.5a) said shared shift register being further coupled to the serial input for serially receiving said configuration instructions;

(b.5b) said shared shift register being further coupled to the first serial output for serially shifting out said configuration instructions by way of the first serial output; and (b.5c) said shared shift register being further coupled to the second serial output for serially shifting out said verification data by way of the second serial output; and wherein within said programming and verification method:

(c.1) said first shifting includes shifting externally-sourced configuration instructions into the shared shift register;

(e.1) said second transferring includes parallel transferring into the shared shift register the stored data transferred from the EE-NVIS array; and (f.1) second shifting includes shifting out of said shared shift register, the stored data that had been transferred by said second transferring step.

43. The in-system programming and verification method of claim 42 wherein:

(f.1a) said shifting of the stored data out of said shared shift register occurs contemporaneously with a next memory access operation of the EE-NVIS array.

44. The in-system programming and verification method of claim 41 wherein said first serial output of the serial interface circuit further includes:

(b.2a) a tristate output driver by way of which said configuration instructions can be serially output to a to-be-configured device, said tristate output driver having a high impedance output mode that is controllably-selectable, and wherein said programming and verification method further includes the step of:

(g) maintaining said tristate output driver in the high impedance output mode at least while said step (c) of first shifting occurs and while said step (d) of first transferring the shifted-in configuration instructions into the EE-NVIS array occurs.

45. An end-use system comprising:

(a) an in-system reconfigurable, programmable logic device (PLD); and (b) an in-system reconfigurable, restoring device, where the restoring device is operatively coupled to, but not monolithically integrated with the PLD for transmitting restoring configuration instructions of the PLD, and where the restoring device comprises an integrated circuit chin incorporating:

(b.1) an electrically erasable and reprogrammable, non-volatile integrated storage array (EE-NVIS array) for storing configuration instructions; and (b.2) a serial interface circuit, wherein the serial interface circuit includes:

(b.2a) a first, bidirectional coupling to the EE-NVIS array by way of which configuration instructions can be bidirectionally transferred between the EE-NVIS array and the serial interface circuit;

(b.2b) a first serial output by way of which configuration instructions can be serially output to the to-be-configured device; and (b.2c) a serial input by way of which configuration instructions can be input to the serial interface circuit for subsequent transfer by way of the first, bidirectional coupling from the serial interface circuit to EE-NVIS array.

46. The end-use system of claim 45 wherein:

the PLD includes a volatile configuration memory; and the EE_NVIS array of the restoring device includes FLASH memory cells.

47. The end-use system of claim 45 wherein said serial input is part of a 4-wire interface further comprising:

(b.2d) a second serial output by way of which stored configuration instructions can be serially output for verification;

(b.2e) a serial clock input for receiving clock signals of said 4-wire interface; and (b.2f) a mode input for receiving mode-control signals of said 4-wire interface.

48. The end-use system of claim 47 wherein said 4-wire interface is a JTAG interface.

49. A configuration restoring device for transmitting configuration data to a to-be-configured device that is not monolithically integrated with said restoring device, said restoring device comprising a protective package and within said package:

(a) an electrically erasable and reprogrammable, nonvolatile integrated storage array (EE-NVIS array) for storing data; and (b) a serial interface circuit, wherein the serial interface circuit includes:

(b.1) a bidirectional coupling to the EE-NVIS array by way of which data can be bidirectionally and parallel-wise transferred between the EE-NVIS array and the serial interface circuit;

(b.2) an initial serial input by way of which initial data can be serially input from an external source to the serial interface circuit at least for subsequent transfer by way of the bidirectional coupling from the serial interface circuit to the EE-NVIS array for storage in said EE-NVIS array; and (b.3) a first serial output by way of which first data can be serially transmitted from the restoring device to the to-be-configured device, said serially transmitted first data including at least data stored in said EE-NVIS array and transferred by way of the bidirectional coupling from the EE-NVIS array to the serial interface circuit.

50. The configuration restoring device of claim 49 wherein said EE-NVIS array and said serial interface circuit are incorporated within a monolithic integrated circuit.

51. The configuration restoring device of claim 50 wherein said serial interface circuit further includes:

(b.4) a second serial output by way of which one or both of the initial data and data stored in the EE-NVIS array can be serially transmitted as second data from the restoring device to an external other device.

52. The configuration restoring device of claim 51 wherein said serial interface circuit further includes:

(b.5) a shared shift register coupled to the EE-NVIS array by way of said bidirectional coupling for parallel-wise transferring data between the EE-NVIS array and the shift register, (b.5a) said shared shift register being further coupled to the serial input for serially receiving said initial data;

(b.5b) said shared shift register being further coupled to the first serial output for serially shifting out said first data by way of the first serial output; and (b.5c) said shared shift register being further coupled to the second serial output for serially shifting out said second data by way of the second serial output.

53. The configuration restoring device of claim 52 wherein said serial interface circuit further includes:

(b.6) a clock-selecting multiplexer coupled to the shared shift register for driving a clock input of the shared shift register with a controllably selectable one of plural clock signals.

54. The configuration restoring device of claim 53 wherein said plural clock signals include:

(b.6a) a first externally-defined clock signal that is usable for synchronizing transmission of said first serial data from the first serial output; and (b.6b) a second externally-defined clock signal that is usable for synchronizing transmission of said second serial data from the second serial output and that is further usable for synchronizing serial receipt of said initial data at the initial serial input where said first and second externally-defined clock signals can be independent of one another.

55. The configuration restoring device of claim 54 wherein said plural clock signals further include:

(b.6c) an internally-synthesized third clock signal.

56. The configuration restoring device of claim 54 and further comprising within said monolithic integrated circuit:

(c) addressing means operatively coupled to said EE-NVIS array and to at least one of said plural clock signals for stepping through addressable locations of said EE-NVIS array in synchronism with the at least one of the plural clock signals.

57. The configuration restoring device of claim 56 and further comprising within said monolithic integrated circuit:

(d) shift control means operatively coupled to said shared shift register for causing serial shift operations of the shared shift register to occur contemporaneously with memory access operations of the EE-NVIS array.

58. The configuration restoring device of claim 56 and further comprising within said monolithic integrated circuit:

(d) decoding means operatively coupled to said EE-NVIS array and to said addressing means and to said first serial output for controlling operations of said EE-NVIS array and said addressing means and said first serial output, the decoding means being responsive in its controlling of said operations to an externally-supplied device-select signal and to an externally-supplied device-reset signal.

59. The configuration restoring device of claim 58 wherein said first serial output includes:

(b.3a) a tristate output driver by way of which said first data can be serially transmitted from the restoring device to the to-be-configured device, said tristate output driver having a high impedance output mode that is controllably-selectable by the decoding means.

60. The configuration restoring device of claim 49 wherein said to-be-configured device is disposed outside said protective package.

61. An in-system programmable, configuration establishing device for receiving downloaded configuration data and transmitting such downloaded configuration data to an external, to-be-configured device, said establishing device comprising a monolithic integrated circuit incorporating:

(a) an electrically erasable and reprogrammable, nonvolatile integrated storage array (EE-NVIS array) which is in-system programmable for receiving and storing configuration data;

(b) a first serial interface circuit operatively coupled to said EE-NVIS array, said first serial interface circuit providing an in-loading path by way of which new configuration data can be serially transferred into said integrated circuit for in-system storage within the EE-NVIS array; and (c) a second serial interface circuit, also operatively coupled to said EE-NVIS array, said second serial interface circuit providing an out-loading path by way of which configuration data stored within the EE-NVIS array can be serially transferred out of said integrated circuit to said external to-be-configured device, the first and second serial interface circuits being sufficiently independent of one another such that respective first and second serial transfer rates of the first and second serial interface circuits can be independent of one another.

62. The in-system programmable, configuration establishing device of claim 61 wherein the second serial interface circuit includes:

(c.1) a tristate output driver by way of which said stored configuration data can be serially output to the to-be-configured device, said tristate output driver having a high impedance output mode that is controllably-selectable.

63. The in-system programmable, configuration establishing device of claim 62 wherein the first serial interface circuit further includes:

(b.1) a serial verification-providing path by way of which stored configuration data of the EE-NVIS array can be serially transferred out of said integrated circuit for verification.

64. The in-system programmable, configuration establishing device of claim 63 wherein said EE-NVIS array and said serial verification-providing path have respective, bits per second read-out rates and the bits per second read-out rate of the EENVIS is faster than the bits per second read-out rate of the serial verification-providing path.

65. The in-system programmable, configuration establishing device of claim 64 wherein the bits per second read-out rate of the EENVIS is at least about 12 Megabits per second.

66. The in-system programmable, configuration establishing device of claim 62 and further comprising within said monolithic integrated circuit:

(d) address sequencing means for automatically sequencing through addressable locations of the EE-NVIS array; and (e) cascade signaling means for signaling to external devices when sequencing by the address sequencing means has reached a predefined value.

67. The in-system programmable, configuration establishing device of claim 66 and further comprising within said monolithic integrated circuit:

(f) control logic, operatively coupled to said cascade signaling means for switching said tristate output driver into the high impedance output mode when the cascade signaling means signals that said predefined value has been reached.

68. The in-system programmable, configuration establishing device of claim 67 and further comprising within said monolithic integrated circuit:

(g) power control means, operatively coupled to said control logic, for switching said establishing device into a relatively low power, standby mode when the establishing device is deselected, where said standby mode consumes less power than does a normal power mode of the establishing device.

69. The in-system programmable, configuration establishing device of claim 67 and further comprising within said monolithic integrated circuit:

(g) power-up detecting means for detecting a power-up sequence and for responsively initiating a transfer of stored data from the EE_NVIS array to the out-loading path of the second serial interface circuit.

70. The in-system programmable, configuration establishing device of claim 62 and further comprising within said monolithic integrated circuit:

(d) mode-selection means, operatively coupled to the out-loading path of the second serial interface circuit, for receiving from said out-loading path, when the high impedance output mode is selected, a programming or verification selecting signal and for responsively placing said establishing device in a corresponding one of program and verify modes.

71. The in-system programmable, configuration establishing device of claim 66 and further comprising within said monolithic integrated circuit:

(f) a polarity-programmable, output enable and reset means that is operatively coupled to the address sequencing means and to the tristate output driver for correspondingly resetting the address sequencing means and enabling an active output mode for the tristate output driver in response to opposed binary states of an externally-supplied, OE/Reset signal.

* * * * *

UNITED STATES PATENT AND TRADEMARK OFFICE
CERTIFICATE OF CORRECTION

PATENT NO. : 6,102,963
DATED : August 15, 2000
INVENTOR(S) : Om P. Agrawal

It is certified that error appears in the above-identified patent and that said Letters Patent is hereby corrected as shown below:

Column 10,
Line 60, "IJTAGI" should be -- 'JTAG' --.

Column 13,
Line 12, "Ain" should be -- $A_{in}$ --.

Column 15,
Line 35, "ICS" should be -- /CS --.

Column 16,
Line 8, "ICS" should be -- /CS --.

Column 17,
Line 27, "Din" should be -- $D_{in}$ --;
Line 53, "TSCLK" should be -- $TS_{CLK}$ --.

Column 20,
Line 13, "chin" should be -- chip --;
Line 40, "claim 1" should be -- claim 18 --.

Column 22,
Line 1, "claim 3" should be -- claim 15 --.

Column 23,
Lines 1, 13, 17, "claim 15" should be -- claim 19 --.

UNITED STATES PATENT AND TRADEMARK OFFICE
CERTIFICATE OF CORRECTION

PATENT NO.   : 6,102,963
DATED        : August 15, 2000
INVENTOR(S)  : Om P. Agrawal It is certified that error appears in the above-identified patent and that said Letters Patent is hereby corrected as shown below:

Column 24,
Line 33, delete "an".

Column 25,
Line 64, "chin" should be -- chip --.

Signed and Sealed this

Thirteenth Day of November, 2001

Attest:

*Nicholas P. Godici*

NICHOLAS P. GODICI
*Attesting Officer*   *Acting Director of the United States Patent and Trademark Office*